US012573816B2

(12) United States Patent (10) Patent No.: US 12,573,816 B2
Samonji (45) Date of Patent: Mar. 10, 2026

(54) LIGHT SOURCE MODULE, PROCESSING MACHINE, AND PROCESSING METHOD

(71) Applicant: Nuvoton Technology Corporation Japan, Kyoto (JP)

(72) Inventor: Katsuya Samonji, Toyama (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 877 days.

(21) Appl. No.: 17/889,052

(22) Filed: Aug. 16, 2022

(65) Prior Publication Data

US 2022/0393428 A1 Dec. 8, 2022

Related U.S. Application Data

(63) Continuation of application No. PCT/JP2021/006847, filed on Feb. 24, 2021.

(30) Foreign Application Priority Data

Feb. 26, 2020 (JP) ................................. 2020-031064

(51) Int. Cl.
*H01S 5/068* (2006.01)
*B23K 26/06* (2014.01)
(Continued)

(52) U.S. Cl.
CPC .......... *H01S 5/068* (2013.01); *B23K 26/0613* (2013.01); *B23K 26/0626* (2013.01);
(Continued)

(58) Field of Classification Search
CPC ...... H01S 5/068; H01S 5/4012; H01S 5/4087; B23K 26/0626
See application file for complete search history.

(56) References Cited

U.S. PATENT DOCUMENTS

| | | | |
|---|---|---|---|
| 6,522,675 B1 | 2/2003 | Tajima | |
| 2001/0026573 A1 | 10/2001 | Takayami et al. | |
| 2017/0304941 A1* | 10/2017 | Usuda | B23K 26/0876 |

FOREIGN PATENT DOCUMENTS

| | | |
|---|---|---|
| JP | 2000-164977 A | 6/2000 |
| JP | 2001-284732 A | 10/2001 |

(Continued)

OTHER PUBLICATIONS

International Search Report issued on Apr. 27, 2021 in International Patent Application No. PCT/JP2021/006847, with English translation.

*Primary Examiner* — Michael Carter
(74) *Attorney, Agent, or Firm* — Rimon P.C.

(57) ABSTRACT

A light source module that emits a combined laser beam, and includes: a plurality of semiconductor laser elements; and a control circuit that controls power of a laser beam emitted by each of the semiconductor laser elements. The semiconductor laser elements include: a first element group that emits a first laser beam; and a second element group that emits a second laser beam. The combined laser beam includes at least one of the first laser beam or the second laser beam. The control circuit maintains an average combined-beam wavelength that is an average wavelength of the combined laser beam constant for a change in power of the combined laser beam. When the power of the first laser beam and the power of the second laser beam are equal to each other, an average wavelength of the first laser beam is longer than an average wavelength of the second laser beam.

20 Claims, 16 Drawing Sheets

(51) Int. Cl.

| | | |
|---|---|---|
| *B23K 26/062* | (2014.01) | |
| *H01S 5/40* | (2006.01) | |
| *B23K 103/12* | (2006.01) | |
| *H01S 5/323* | (2006.01) | |

(52) U.S. Cl.

CPC .......... *H01S 5/4012* (2013.01); *H01S 5/4018* (2013.01); *H01S 5/4025* (2013.01); *H01S 5/4087* (2013.01); *B23K 2103/12* (2018.08); *H01S 5/32341* (2013.01)

(56)     References Cited

FOREIGN PATENT DOCUMENTS

| | | | |
|---|---|---|---|
| JP | 2002-164615 | A | 6/2002 |
| JP | 2002-270956 | A | 9/2002 |
| JP | 2015-50225 | A | 3/2015 |
| JP | 2016-078048 | A | 5/2016 |
| JP | 2018-031622 | A | 3/2018 |

* cited by examiner

FIG. 3

| Operating point | Combined laser beam | First laser beam | Second laser beam |
|---|---|---|---|
| | Pt [W] | P1 [W] | P2 [W] |
| 1 | 0.9 | 0.9 | 0.0 |
| | ⋮ | ⋮ | ⋮ |
| 2 | 4.3 | 3.5 | 0.8 |
| | ⋮ | ⋮ | ⋮ |
| 3 | 7.5 | 5.0 | 2.5 |
| | ⋮ | ⋮ | ⋮ |
| 4 | 11.0 | 5.5 | 5.5 |

Operating point 1 (Pt = 0.9 W)

Operating point 2 (Pt = 4.3 W)

Operating point 3 (Pt = 7.5 W)

Target average wavelength

First laser beam

Second laser beam

Operating point 4 (Pt = 11.0 W)

Target average wavelength

First laser beam

Second laser beam

When range of wavelength included
in combined laser beam is narrow

When range of wavelength included
in combined laser beam is wide

FIG. 9

| Operating point | Combined laser beam | First laser beam | Second laser beam | Third laser beam |
|---|---|---|---|---|
| | Pt [W] | P1 [W] | P2 [W] | P3 [W] |
| 1 | 0.9 | 0.9 | 0.0 | 0.0 |
| | ⋮ | ⋮ | ⋮ | 0.0 |
| 2 | 3.1 | 2.3 | 0.8 | 0.0 |
| | ⋮ | ⋮ | ⋮ | 0.0 |
| 3 | 6.0 | 3.5 | 2.5 | 0.0 |
| | ⋮ | ⋮ | ⋮ | ⋮ |
| 4 | 11.5 | 5.0 | 4.5 | 2.0 |
| | ⋮ | ⋮ | ⋮ | ⋮ |
| 5 | 16.5 | 5.5 | 5.5 | 5.5 |

Operating point 4 (Pt = 11.5 W)

Operating point 5 (Pt = 16.5 W)

1

LIGHT SOURCE MODULE, PROCESSING MACHINE, AND PROCESSING METHOD

CROSS REFERENCE TO RELATED APPLICATIONS

This is a continuation application of PCT International Application No. PCT/JP2021/006847 filed on Feb. 24, 2021, designating the United States of America, which is based on and claims priority of Japanese Patent Application No. 2020-031064 filed on Feb. 26, 2020. The entire disclosures of the above-identified applications, including the specifications, drawings and claims are incorporated herein by reference in their entirety.

FIELD

The present disclosure relates to a light source module, a processing machine, and processing method.

BACKGROUND

Conventionally, laser beams have been used for processing applications, and thus high-power and high-efficiency laser light sources are necessary. Semiconductor laser elements are used as such laser light sources.

In the processing applications, there are cases where the output of the laser beam is varied. When the power of the laser beam of a semiconductor laser element is varied, the wavelength of the laser beam is also varied. When the laser beam emitted by such a semiconductor laser element is Irradiated onto a material to be processed, the rate of absorption of the laser beam can change according to the wavelength of the laser beam. Here, the optical absorption spectrum of the material to be processed will be described with reference to FIG. 13. FIG. 13 is a graph illustrating the optical absorption spectra of metals. FIG. 13 illustrates the optical absorption spectra of seven types of metals such as Cu at wavelengths of at least 400 nm and at most 1200 nm. In FIG. 13, the horizontal axis of the graph indicates wavelengths and the vertical axis indicates the rates of absorption. As illustrated in FIG. 13, for example, the rate of absorption of Cu is approximately 65% when the wavelength is approximately 450 nm, whereas the rate of absorption is approximately 5% when the wavelength is approximately 1070 nm. In addition, as illustrated in FIG. 13, the optical absorption spectra are different for different materials.

As described above, the rate of absorption of the laser beam of the processing target depends on the wavelength and material. For that reason, there arises a problem when the wavelength of the laser beam varies according to power, in particular, when a composite material that is a combination of multiple materials is processed. In other words, when a laser beam is irradiated onto a composite material, the following state can occur: the composite material melts uniformly when the power of the laser beam is at a predetermined value, but when the power of the laser beam varies from the predetermined value, only a portion corresponding to a certain material in the composite material melts, while the other portions do not melt.

As a technique that solves such a problem, for example, Patent Literature (PTL) 1 describes a light source module that monitors the wavelength of a laser beam emitted by a semiconductor laser element and controls the temperature of the semiconductor laser element to cause the wavelength to be constant.

2

CITATION LIST

Patent Literature

PTL 1: Japanese Unexamined Patent Application Publication No. 2000-164977

SUMMARY

Technical Problem

However, with the light source module described in PTL 1, it is necessary to use a wavelength monitor, a heating/cooling element, etc. to control the temperature of the semiconductor laser element, which makes the configuration complex.

The present disclosure solves such a problem, and provides a light source module, etc. which has a simplified configuration and is capable of emitting a laser beam with reduced power dependency of the average wavelength.

Solution to Problem

In order to solve the above-described problems, one aspect of a light source module according to the present disclosure is a light source module that emits a combined laser beam, and includes: a plurality of semiconductor laser elements; and a control circuit that controls power of a laser beam emitted by each of the plurality of semiconductor laser elements. In the light source module: the plurality of semiconductor laser elements include (i) a first element group that includes one or more first semiconductor laser elements and emits a first laser beam (ii) and a second element group that includes one or more second semiconductor laser elements and emits a second laser beam; the combined laser beam includes at least one of the first laser beam or the second laser beam; the control circuit controls power of the first laser beam and power of the second laser beam to maintain an average combined-beam wavelength constant for a change in power of the combined laser beam, the average combined-beam wavelength being an average wavelength of the combined laser beam; and when the power of the first laser beam and the power of the second laser beam are equal to each other, an average wavelength of the first laser beam is longer than an average wavelength of the second laser beam.

As described above, the combined laser beam output by the light source module according to the present disclosure includes at least one of the first laser beam or the second laser beam. For this reason, even when the average wavelength of the first laser beam increases as the power of the first laser beam increases, it is possible to reduce the power dependency of the average combined-beam wavelength, by increasing the power of the second laser beam which has an average wavelength shorter than an average wavelength of the first laser beam. In addition, the light source module according to the present disclosure does not require a wavelength monitor and the like used in the light source module described in PTL 1, and thus has a configuration more simplified than a configuration of the light source module described in PTL 1.

In addition, in regard to a positional aspect of the light source module according to the present disclosure, the average wavelength of the first laser beam may increase as the power of the first laser beam increases, and the control circuit may control the power of the first laser beam and the power of the second laser beam to increase a ratio of the second laser beam in the combined laser beam as the power of the first laser beam increases.

In this manner, it is possible to more reliably reduce the power dependency of the average combined-beam wavelength.

In addition, in one aspect of the light source module according to the present disclosure, the power of the first laser beam may be higher than or equal to the power of the second laser beam.

In this manner, it is possible to maintain the average combined-beam wavelength constant, by maintaining the relationship between the power of the first laser beam and the power of the second laser beam.

In addition, in one aspect of the light source module according to the present disclosure, the one or more first semiconductor laser elements may comprise a plurality of first semiconductor laser elements, and the plurality of first semiconductor laser elements may each emit a laser beam having an identical wavelength.

In this manner, since the first element group comprises the plurality of semiconductor laser elements, it is possible to increase the power of the first laser beam.

In addition, in one aspect of the light source module according to the present disclosure, the plurality of first semiconductor laser elements may be connected in series.

In this manner, it is possible to reduce the amount of current necessary for driving the light source module by connecting the plurality of first semiconductor laser elements in series, compared to the case of connecting the plurality of first semiconductor laser elements in parallel. As a result, it is possible to downsize the power supply necessary for driving the light source module.

In addition, in one aspect of the light source module according to the present disclosure, $\lambda 12-\lambda 11 > \lambda t2-\lambda t1$ may be satisfied, where: $\lambda 11$ denotes the average wavelength of the first laser beam and $\lambda t1$ denotes the average combined-beam wavelength, when the power of the combined laser beam is first power; and $\lambda 12$ denotes the average wavelength of the first laser beam and $\lambda t2$ denotes the average combined-beam wavelength, when the power of the combined laser beam is second power higher than the first power.

With the light source module according to the present disclosure, when the power of the combined laser beam is increased from the first power to the second power, the average wavelength of the first laser beam and the average combined-beam wavelength can be lengthened as the power of the first laser beam included in the combined laser beam is increased. In such a case, the combined laser beam is combined with the second laser beam having an average wavelength shorter than an average wavelength of the first laser beam. As a result, it is possible to at least partially offset the lengthening of the wavelength of the combined laser beam. In other words, it is possible to reduce the power dependency of the average combined-beam wavelength, by using the second laser beam.

In addition, in one aspect of the light source module according to the present disclosure, when all of the plurality of semiconductor laser elements operate at a maximum rated output, the average combined-beam wavelength may match the average wavelength of the first laser beam at a minimum laser output.

According to the above-described configuration, by setting the average combined-beam wavelength to the average wavelength of the first laser beam at the minimum power (or the average combined-beam wavelength when all of the plurality of semiconductor laser elements operate at the maximum rated output), it is possible to maintain the average wavelength constant over the entire range from the minimum power to the maximum rated power (that is, power at maximum rated output) of the combined laser beam that can be emitted by the light source module.

In addition, when the power of the first laser beam is close to the minimum power, the average wavelength of the first laser beam is likely to vary due to a change in temperature, etc. When the first laser beam and the second laser beam are included in the combined laser beam having a power close to the minimum power, the power of the first laser beam becomes lower compared to the case where only the first laser beam is included in the combined laser beam, and thus it is difficult to stabilize the average wavelength of the first laser beam. It should be noted that, in this case, the power of the second laser beam becomes also approximately lower than or equal to the power of the first laser beam, and thus it is also difficult to stabilize the average wavelength of the second laser beam. In other words, the average combined-beam wavelength can be stabilized by causing only the first laser beam to be included in the combined laser beam having a power close to the minimum power. Here, when the average wavelength of the first laser beam at the minimum power matches the average combined-beam wavelength at the maximum rated output of the first laser beam and the second laser beam, as in light source module 1 according to the present embodiment, it is possible to maintain the average combined-beam wavelength at the minimum power of the first laser beam over the entire range from the minimum power to the maximum rated power of the combined laser beam. As described above, when the average combined-beam wavelength is maintained at the average wavelength of the first laser beam at minimum power, only the first laser beam is included in the combined laser beam when the power of the combined laser beam is close to the minimum power. As a result, it is possible to stabilize the average combined-beam wavelength when the power is close to the minimum power.

In addition, in one aspect of the light source module according to the present disclosure, the average wavelength of the first laser beam at a maximum rated power may be at least 5 nm longer than the average wavelength of the first laser beam at a minimum power.

As described above, even when the average wavelength of the first laser beam varies by at least 5 nm according to the power, it is possible to maintain the average combined-beam wavelength constant, by appropriately controlling the power of the second laser beam.

In addition, in one aspect of the light source module according to the present disclosure, the control circuit may control the power of the laser beam emitted by each of the plurality of semiconductor laser elements to cause the average combined-beam wavelength to match the average combined-beam wavelength when all of the plurality of semiconductor laser elements operate at a maximum rated output.

In this manner, it is possible to maintain the average combined-beam wavelength constant in a range that includes the maximum rated power of the combined laser beam that can be emitted by the light source module. As a result, it is possible to implement a light source module capable of emitting a high-power combined laser beam.

In addition, in one aspect of the light source module according to the present disclosure, the one or more first semiconductor laser elements and the one or more second semiconductor laser elements may each include a nitride semiconductor.

With this configuration, it is possible to emit a blue laser beam, and thus the light source module capable of emitting a laser beam that can process metals such as Cu and Au, for example, can be implemented.

In addition, in one aspect of the light source module according to the present disclosure, a difference between the average wavelength of the first laser beam and the average wavelength of the second laser beam may be less than or equal to 20 nm.

In addition, in one aspect of the light source module according to the present disclosure, the average combined-beam wavelength that is the average combined-beam wavelength may be at least 400 nm and at most 500 nm.

In order to solve the above-described problems, one aspect of a processing machine according to the present disclosure is a processing machine including the above-described light source module.

According to the above-described configuration, it is possible to emit a laser beam with reduced power dependency of the average wavelength. As a result, it is possible to easily process a composite material that is a combination of a plurality of materials. In addition, the processing machine according to the present disclosure does not require a wavelength monitor and the like used in the light source module described in PTL 1. Accordingly, the processing machine according to the present disclosure has a simplified configuration.

In addition, in order to solve the above-described problems, one aspect of a processing method according to the present disclosure is a processing method of processing a material using a combined laser beam emitted from a light source module. The light source module includes a plurality of semiconductor laser elements, the plurality of semiconductor laser elements includes: a first element group that includes one or more first semiconductor laser elements and emits a first laser beam; and a second element group that includes one or more second semiconductor laser elements and emits a second laser beam, the combined laser beam includes at least one of the first laser beam or the second laser beam. The processing method includes: controlling power of the first laser beam and power of the second laser beam to maintain an average combined-beam wavelength constant for a change in power of the combined laser beam, the average combined-beam wavelength being an average wavelength of the combined laser beam. In the processing method, when the power of the first laser beam and the power of the second laser beam are equal to each other, an average wavelength of the first laser beam is longer than an average wavelength of the second laser beam, the average wavelength of the first laser beam increases as the power of the first laser beam increases.

According to the above-described configuration, it is possible to emit a laser beam with reduced power dependency of the average wavelength. As a result, it is possible to easily process a composite material that is a combination of a plurality of materials.

In addition, in one aspect of the processing method according to the present disclosure, in the controlling, the power of the first laser beam and the power of the second laser beam may be each controlled to increase a ratio of the second laser beam in the combined laser beam as the power of the first laser beam increases.

In this manner, it is possible to more reliably reduce the power dependency of the average combined-beam wavelength.

In addition, in one aspect of the processing method according to the present disclosure, $\lambda 12 - \lambda 11 > \lambda t2 - \lambda t1$ may be satisfied, where: $\lambda 11$ denotes the average wavelength of the first laser beam and $\lambda t1$ denotes the average combined-beam wavelength, when the power of the combined laser beam is first power; and $\lambda 12$ denotes the average wavelength of the first laser beam and $\lambda t2$ denotes the average combined-beam wavelength, when the power of the combined laser beam is second power higher than the first power.

With the processing method according to the present disclosure, when the power of the combined laser beam is increased from the first power to the second power, the average wavelength of the first laser beam and the average combined-beam wavelength can be lengthened as the power of the first laser beam included in the combined laser beam is increased. In such a case, the combined laser beam is combined with the second laser beam having an average wavelength shorter than the average wavelength of the first laser beam. As a result, it is possible to at least partially offset the lengthening of the wavelength of the combined laser beam. In other words, it is possible to reduce the power dependency of the average combined-beam wavelength, by using the second laser beam.

In addition, in one aspect of the processing method according to the present disclosure, a difference between the average wavelength of the first laser beam and the average wavelength of the second laser beam may be less than or equal to 20 nm.

In addition, in one aspect of the processing method according to the present disclosure, the average combined-beam wavelength may be at least 400 nm and at most 500 nm.

In addition, in one aspect of the processing method according to the present disclosure, the material may include Au or Cu.

Au and Cu have a relatively high wavelength dependency of absorption. However, even when performing the processing on such materials, the power dependency of the average wavelength is reduced when performing the processing method according to the present disclosure, and thus it is possible to perform the processing stably even when the power is varied. In addition, a laser beam having a wavelength with a high rate of absorption (approximately 450 nm) in Au and Cu can be generated, for example, by using semiconductor laser elements including a nitride semiconductor as a plurality of semiconductor laser elements.

In addition, in one aspect of the processing method according to the present disclosure, the controlling may include irradiating the material with the combined laser beam while varying the power of the combined laser beam.

Accordingly, even when processing is carried out while varying the power of the combined laser beam, it is possible to implement stable processing because the variation of the average combined-beam wavelength is reduced.

Advantageous Effects

According to the present disclosure, it is possible to provide a light source module or the like that has a simplified configuration and is capable of emitting a laser beam with reduced power dependency of the average wavelength.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 3 is a table illustrating the relationship between the power of the combined laser beam, the power of the first laser beam, and the power of the second laser beam of the light source module according to Embodiment 1.

FIG. 9 is a table illustrating the relationship between the power of the combined laser beam, the power of the first laser beam, the power of the second laser beam, and the power of the third laser beam of the light source module according to Embodiment 2.

DESCRIPTION OF EMBODIMENTS

Hereinafter, embodiments of the present disclosure will be described with reference to the drawings. It should be noted that each of the embodiments described below shows a specific example of the present disclosure. Therefore, numerical values, shapes, materials, structural components, the arrangement and connection of the structural components, etc. indicated in the following embodiments are mere examples, and are not intended to limit the scope of the present disclosure.

In addition, each of the diagrams is a schematic diagram and thus is not necessarily strictly illustrated. Therefore, the scale sizes and the like are not necessarily exactly represented in each of the diagrams. In each of the diagrams, substantially the same structural components are assigned with the same reference signs, and redundant descriptions will be omitted or simplified.

Embodiment 1

The following describes a light source module, a processing machine, and a processing method according to Embodiment 1.

1-1. Overall Configuration

Figure 1:
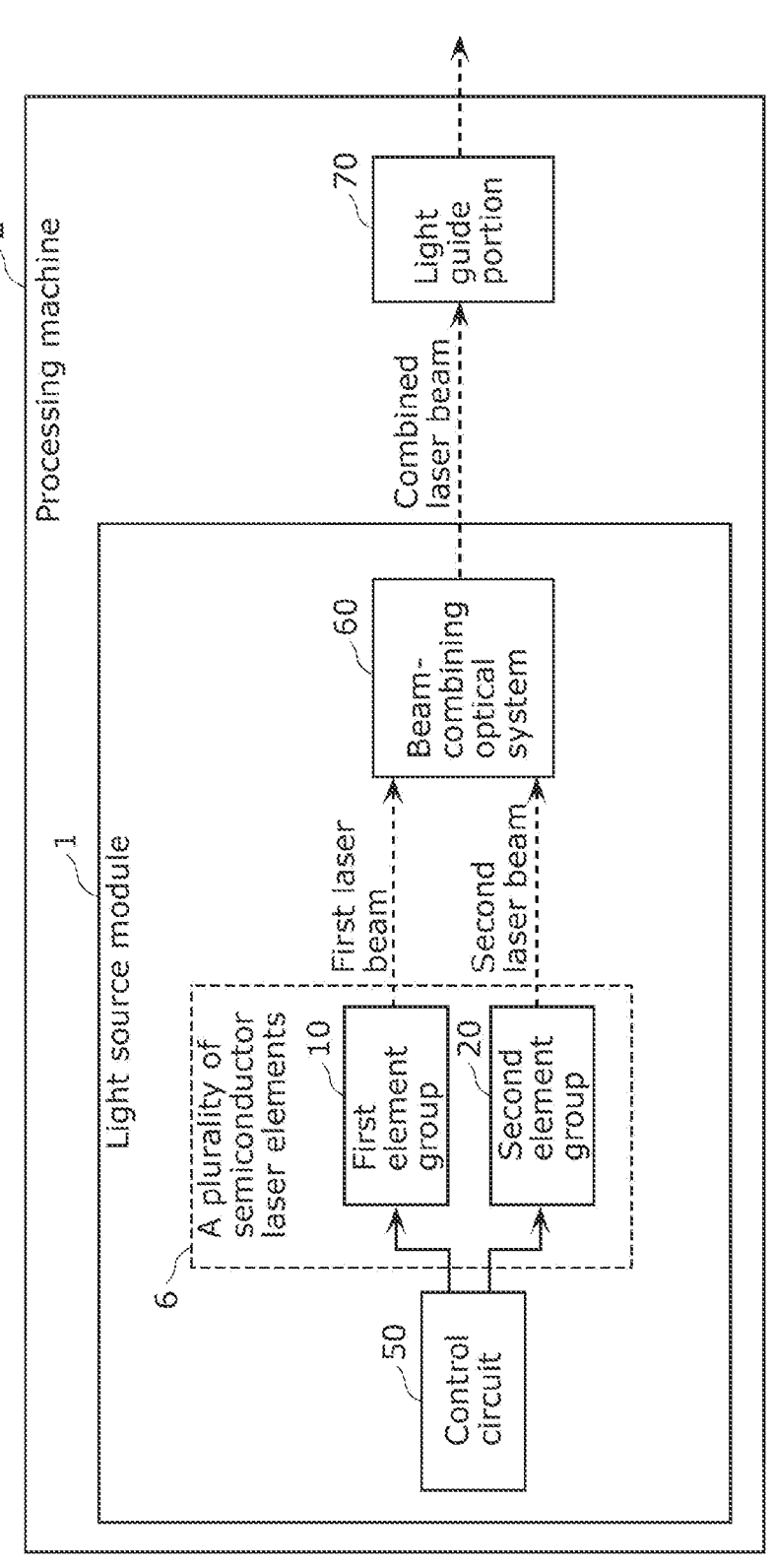
FIG. 1 is a block diagram illustrating a functional configuration of a light source module and a processing machine according to Embodiment 1.

First, the overall configuration of the light source module and the processing machine according to the present embodiment will be described with reference to FIG. 1. FIG. 1 is a block diagram illustrating the functional configuration of light source module 1 and processing machine 2 according to the present embodiment.

As illustrated in FIG. 1, processing machine 2 is a laser processing machine which includes light source module 1. Processing machine 2 irradiates a combined laser beam onto a material or the like which is an irradiation target. The combined laser beam is a laser beam emitted by light source module 1. According to the present embodiment, processing machine 2 further includes light guide portion 70 that guides the combined laser beam emitted by light source module 1 to the irradiation target. Light guide portion 70 is not particularly limited, but includes, for example, an optical component for light guide such as an optical fiber and a mirror, and an optical component for adjusting a laser diameter such as a lens. In addition, processing machine 2 (or light source module 1) may include an inputting component for externally inputting a parameter such as power of the combined laser beam. For example, processing machine 2 may include a keyboard, a touch panel, etc., as the inputting component.

Light source module 1 is a module that emits a combined laser beam, and includes a plurality of semiconductor laser elements 6 and control circuit 50, as illustrated in FIG. 1. According to the present embodiment, light source module 1 further includes beam-combining optical system 60.

The plurality of semiconductor laser elements 6 are the light sources of light source module 1, and include: first element group 10 which includes one or more first semiconductor laser elements and emits a first laser beam; and second element group 20 which includes one or more second semiconductor laser elements and emits a second laser beam. Accordingly, the combined laser beam emitted by light source module 1 includes at least one of the first laser beam or the second laser beam. The first semiconductor laser element included in first element group 10 and the second semiconductor laser element included in second element group 20 differ in the wavelength of the laser beam emitted. When the power of the first laser beam and the power of the second laser beam are equal to each other, the average wavelength of the first laser beam is longer than the average wavelength of the second laser beam. In addition, the average wavelength of the first laser beam is greater than or equal to the average combined-beam wavelength, and the average wavelength of the second laser beam is less than or equal to the average combined-beam wavelength. According to the present embodiment, each of the plurality of semiconductor laser elements 6 includes a nitride semiconductor, and has an active layer that contains InxGa1-xN ($0<x<1$). With this configuration, it is possible to emit a blue laser beam, and thus light source module 1 capable of emitting a laser beam that can process metals such as Cu and Au, for example, can be implemented.

The wavelength of the laser beam emitted by each of the first semiconductor laser element and the second semiconductor laser element can be adjusted, for example, by adjusting the composition ratio of In contained in the active layer. More specifically, the composition ratio of In contained in the active layer of the first semiconductor laser element is made greater than the composition ratio of In contained in the active layer of the second semiconductor laser element, thereby making it possible to make the average wavelength of the first laser beam longer than the average wavelength of the second laser beam.

According to the present embodiment, one or more first semiconductor laser elements included in first element group 10 comprise a plurality of first semiconductor laser elements, and one or more second semiconductor laser elements included in second element group 20 comprise a plurality of second semiconductor laser elements. Each of the plurality of first semiconductor laser elements emits a laser beam having an identical wavelength, and each of the plurality of second semiconductor laser elements emits a laser beam having an identical wavelength. In this specification, the term "identical" means not only the case of being completely identical but also the case of being substantially identical. For example, the phrase "identical wavelength" means that the difference in wavelength is approximately ±1 nm or less. Alternatively, the phrase "identical wavelength" may mean that the difference in wavelength is approximately ±0.5% or less of the wavelength.

Control circuit 50 is a controller that controls the power of the laser beam emitted by each of the plurality of semiconductor laser elements 6. More specifically, control circuit 50 controls the power of the laser beam emitted by each of the plurality of semiconductor laser elements 6, by controlling the power supply that supplies current to the plurality of semiconductor laser elements 6. Control circuit 50 controls the power of the first laser beam emitted by first element group 10 and the power of the second laser beam emitted by second element group 20, thereby maintaining the average combined-beam wavelength, which is the average wavelength of the combined laser beam, constant for a change in the power of the combined laser beam. In this specification, the term "constant" means not only the state of being completely constant but also the state of being substantially constant. For example, when the average wavelength is "constant", it means that the variation of the average wavelength is approximately ±1 nm or less. In addition, when the average wavelength is "constant", it may mean that the variation of the average wavelength is approximately ±0.5% or less of the average wavelength.

According to the present embodiment, control circuit 50 controls each of first element group 10 and second element group 20, thereby controlling the power ratio of the first laser beam and the second laser beam. In this manner, control circuit 50 is capable of controlling the average combined-beam wavelength that is the average wavelength of the combined laser beam. Details of the control method performed by control circuit 50 will be described later.

Beam-combining optical system 60 is an optical system that combines a plurality of laser beams emitted by the plurality of semiconductor laser elements 6. According to the present embodiment, beam-combining optical system 60 combines the first laser beam and the second laser beam. Beam-combining optical system 60 emits a combined laser beam including the first laser beam and the second laser beam. The configuration of beam-combining optical system 60 is not particularly limited. As beam-combining optical system 60, for example, a light collecting element such as a lens may be used, a wavelength dispersing element such as a diffraction grating or a prism may be used, or a polarizing element such as a polarizing plate and a polarizing beam splitter may be used.

1-2. Control Method

Figure 2:
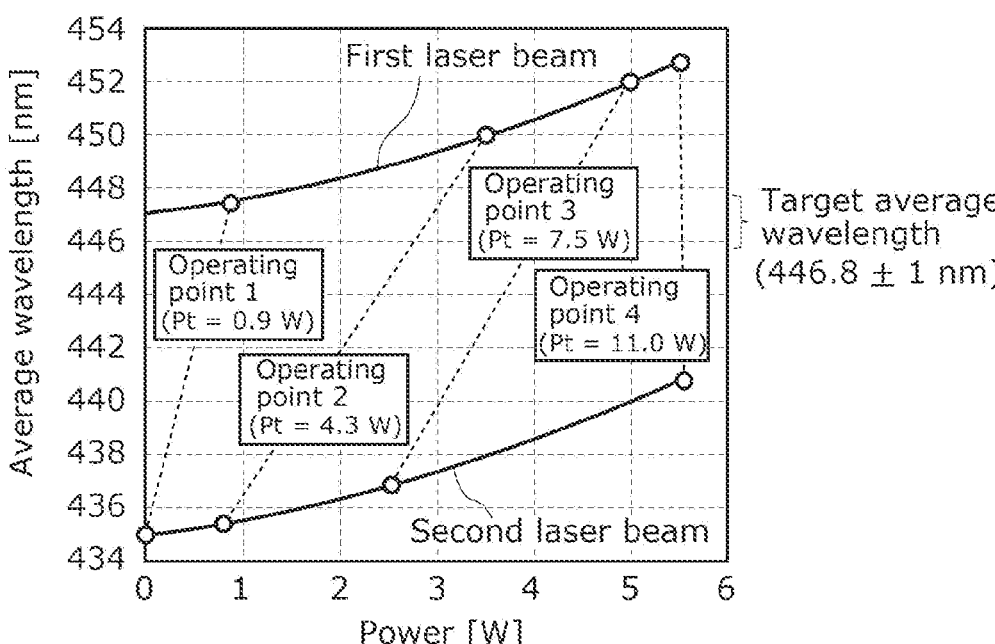
FIG. 2 is a graph illustrating the relationship between the power and the average wavelength of the first laser beam and the second laser beam of the light source module according to Embodiment 1.

Next, the control method of light source module 1 according to the present embodiment will be described with reference to FIG. 2 to FIG. 4D. FIG. 2 is a graph illustrating the relationship between the power and the average wavelength of the first laser beam and the second laser beam of light source module 1 according to the present embodiment. FIG. 2 also illustrates operating points indicating examples of the power of the first laser beam and the power of the second laser beam included in the combined laser beam emitted by light source module 1. FIG. 3 is a table illustrating the relationship between the power of the combined laser beam, the power of the first laser beam, and the power of the second laser beam of light source module 1 according to the present embodiment. FIG. 3 indicates the power of each of the laser beams at operating point 1 through operating point 4. FIG. 4A to FIG. 4D are graphs respectively indicating the optical intensity spectrum of the combined laser beam at operating points 1 to 4 of light source module 1 according to the present embodiment. The horizontal axis of each graph in FIG. 4A to FIG. 4D indicates the wavelength and the vertical axis indicates the optical intensity.

As described above, control circuit 50 controls the power of the first laser beam emitted by first element group 10 and the power of the second laser beam emitted by second element group 20, thereby maintaining the average combined-beam wavelength, which is the average wavelength of the combined laser beam, constant for a change in the power of the combined laser beam. According to the present embodiment, as illustrated in FIG. 2, the target average wavelength of the combined laser beam is 446.8±1 nm, which is comparable to the average wavelength of the first laser beam at minimum power. As illustrated in FIG. 2, the average wavelength of the first laser beam increases as the power increases. For that reason, in order to at least partially offset the change in the average wavelength of the first laser beam, when the average wavelength of the first laser beam is longer than the target average wavelength, the ratio of the second laser beam having an average wavelength shorter than an average wavelength of the first laser beam is increased in the combined laser beam. In this manner, it is possible to reduce the power dependency of the average combined-beam wavelength. It should be noted that the average wavelength of the second laser beam increases as the power increases.

It should be noted that, in this specification, the average wavelength of a laser beam means a weighted average resulting from weighting each wavelength component contained in the laser beam by optical intensity. For example, when a laser beam contains a component of optical intensity Px at wavelength $\lambda x$ and a component of optical intensity Py at wavelength $\lambda y$, the average wavelength $\lambda ave$ is expressed by the following equation.

$$\lambda ave=(Px\cdot\lambda x+Py\cdot\lambda y)/(Px+Py)$$

Figure 4A:
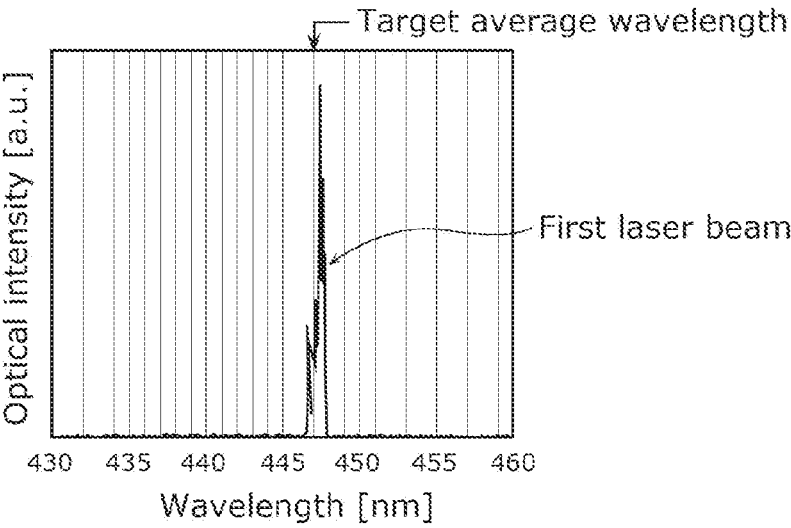
FIG. 4A is a graph indicating an optical intensity spectrum of the combined laser beam at operating point 1 of the light source module according to Embodiment 1.

For example, at operating point 1 at which power of the combined laser beam Pt is 0.9 W, power of the first laser beam P1 is 0.9 W and power of the second laser beam P2 is 0 W, as illustrated in FIG. 2 and FIG. 3. In this case, as illustrated in FIG. 4A, the combined laser beam includes only the first laser beam which is a laser beam having an average wavelength close to the target average wavelength. As described above, when power of the combined laser beam Pt is low, that is, when power of the combined laser beam Pt falls within the range of power of the first laser beam P1 in which the average wavelength of the first laser beam is approximately the target average wavelength, control circuit 50 causes the plurality of semiconductor laser elements 6 to emit only the first laser beam. In other words, control circuit 50 causes a current corresponding to power of the combined laser beam Pt to be supplied only to the first semiconductor laser element among the plurality of semiconductor laser elements 6.

Figure 4B:
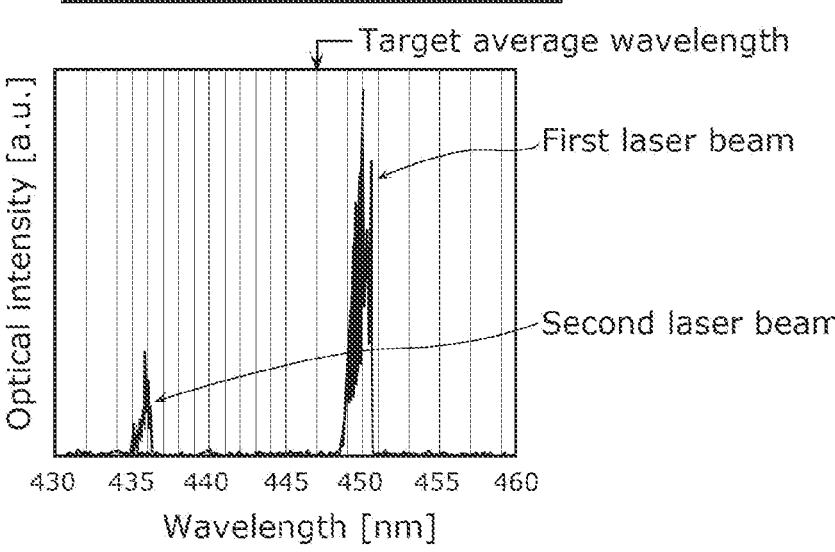
FIG. 4B is a graph indicating an optical intensity spectrum of the combined laser beam at operating point 2 of the light source module according to Embodiment 1.

At operating point 2 at which power of the combined laser beam Pt is 4.3 W, power of the first laser beam P1 is 3.5 W and power of the second laser beam P2 is 0.8 W, as illustrated in FIG. 2 and FIG. 3. In this case, as illustrated in FIG. 4B, the combined laser beam includes a first laser beam having an average wavelength approximately 3 nm longer than the target average wavelength, and a second laser beam having an average wavelength approximately 11 nm shorter than the target average wavelength and significantly lower power than the power of the first laser beam. As described above, when the combined laser beam includes only the first laser beam, in the case where power of the combined laser beam Pt is high to the extent that the average wavelength becomes longer than the target average wavelength, control circuit 50 causes the plurality of semiconductor laser elements 6 to emit, in addition to the first laser beam, a second laser beam having an average wavelength shorter than an average wavelength of the first laser beam. In other words, control circuit 50 causes a current to be supplied to each of the first semiconductor laser element and the second semiconductor laser element. In this manner, it is possible to make the average combined-beam wavelength shorter than the average wavelength of the first laser beam, so as to fall within the target average wavelength.

Figure 4C:
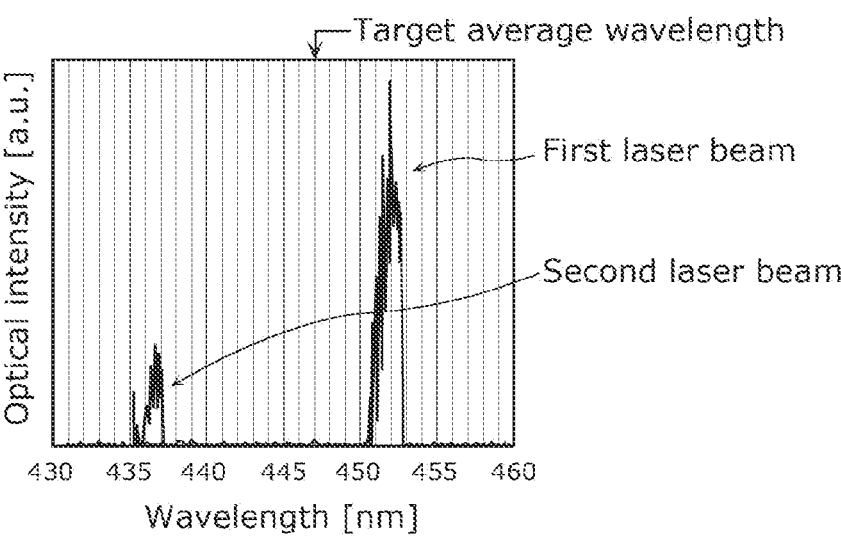
FIG. 4C is a graph indicating an optical intensity spectrum of the combined laser beam at operating point 3 of the light source module according to Embodiment 1.

At operating point 3 at which power of the combined laser beam Pt is 7.5 W, power of the first laser beam P1 is 5.0 W and power of the second laser beam P2 is 2.5 W, as illustrated in FIG. 2 and FIG. 3. In this case, as illustrated in FIG. 4C, the combined laser beam includes a first laser beam having an average wavelength approximately 4 nm longer than the target average wavelength, and a second laser beam having an average wavelength approximately 10 nm shorter than the target average wavelength, and approximately half the power of the first laser beam. As described above, at operating point 3, in the same manner as operating point 2, control circuit 50 causes the plurality of semiconductor laser elements 6 to emit, in addition to the first laser beam, a second laser beam having an average wavelength shorter than an average wavelength of the first laser beam. It should be noted that the average wavelength of the first laser beam is longer at operating point 3 than at operating point 2, and the proportion of the second laser beam in the combined laser beam is increased accordingly.

Figure 4D:
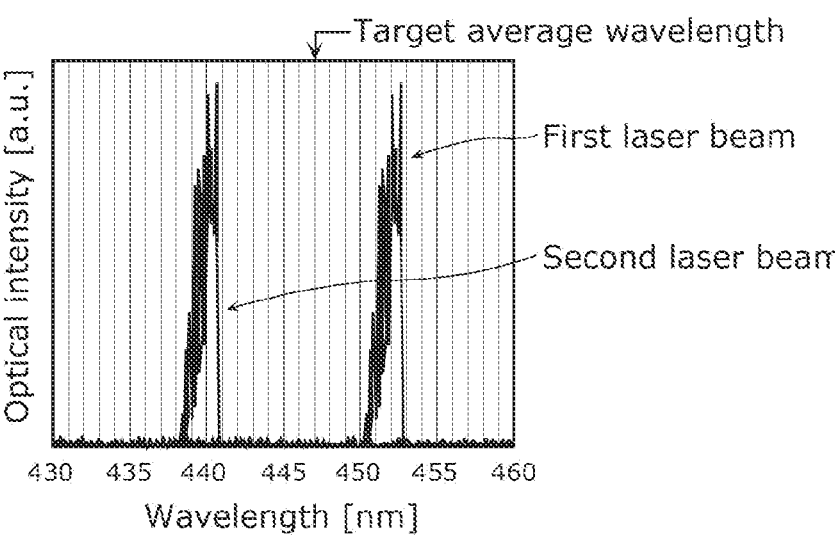
FIG. 4D is a graph indicating an optical intensity spectrum of the combined laser beam at operating point 4 of the light source module according to Embodiment 1.

At operating point 4 at which power of the combined laser beam Pt is 11.0 W, power of the first laser beam P1 and power of the second laser beam P2 are both 5.5 W, as illustrated in FIG. 2 and FIG. 3. In this case, as illustrated in FIG. 4D, the combined laser beam includes a first laser beam having an average wavelength approximately 5 nm longer than the target average wavelength, and a second laser beam having an average wavelength approximately 7 nm shorter than the target average wavelength, and power that is comparable to the power of the first laser beam. As described above, at operating point 4, in the same manner as operating point 2 and operating point 3, control circuit 50 causes the plurality of semiconductor laser elements 6 to emit, in addition to the first laser beam, the second laser beam having an average wavelength shorter than an average wavelength of the first laser beam. It should be noted that the average wavelength of the first laser beam is further longer at operating point 4 than at operating point 3, and the proportion of the second laser beam in the combined laser beam is further increased accordingly. At operating point 4, all of the semiconductor laser elements (i.e., all of the first semiconductor laser elements and all of the second semiconductor laser elements) included in the plurality of semiconductor laser elements 6 operate at the maximum rated output.

It should be noted that each of the above-described operating points is an example of a part of a control mode according to the present embodiment, and thus control circuit 50 controls the power of the first laser beam emitted by first element group 10 and the power of the second laser beam emitted by second element group 20, thereby maintaining the average combined-beam wavelength, which is the average wavelength of the combined laser beam, constant for a change in power of the combined laser beam Pt, even when the power of the combined laser beam differs from the power at each of the above-described operating points. For example, when power of the combined laser beam Pt is lower than 0.9 W, control circuit 50 causes the plurality of semiconductor laser elements 6 to emit only the first laser beam in the same manner as the control mode at operating point 1. In addition, when power of the combined laser beam Pt is higher than 0.9 W and lower than 11.0 W, control circuit 50 causes the plurality of semiconductor laser elements 6 to emit the first laser beam and the second laser beam in the same manner as the control mode at operating point 2 to operating point 4.

As described above, with light source module 1 according to the present embodiment, control circuit 50 appropriately controls the power of the first laser beam and the power of the second laser beam, and thus it is possible to reduce the power dependency of average combined-beam wavelength. In addition, light source module 1 according to the present embodiment does not require a wavelength monitor or other devices used in the technique described in PTL 1, and thus has a simplified configuration.

According to the present embodiment, power of the first laser beam P1 is higher than or equal to power of the second laser beam P2 from the case where power of the combined laser beam Pt is the minimum value to the case where power of the combined laser beam Pt is the maximum value (power Pt is 11.0 W). Accordingly, it is possible to maintain the average combined-beam wavelength constant as described above, by maintaining the relationship between power of the first laser beam P1 and power of the second laser beam P2.

In addition, according to the present embodiment, in the case where: the average wavelength of the first laser beam is $\lambda 11$ and the average combined-beam wavelength is $\lambda t1$ when the power of the combined laser beam is the first power; and the average wavelength of the first laser beam is $\lambda 12$ and the average combined-beam wavelength is $\lambda t2$ when the power of the combined laser beam is the second power which is higher than the first power, the following inequation is satisfied.

$$\lambda 12 - \lambda 12 > \lambda t2 - \lambda t1$$

For example, as illustrated in FIG. 2, when the first power is 4.3 W which is power of the combined laser beam Pt at operating point 2, average wavelength $\lambda 11$ of the first laser beam is approximately 450 nm and average combined-beam wavelength $\lambda t1$ is approximately 447 nm. Meanwhile, when the first power is 7.5 W which is power of the combined laser beam Pt at operating point 3, average wavelength $\lambda 12$ of the first laser beam is approximately 452 nm and average combined-beam wavelength $\lambda t2$ is approximately 447 nm. Accordingly, $\lambda 12 - \lambda 11$ is approximately 2 nm, and $\lambda t2 - \lambda t1$ is approximately 0 nm, and thus the above-described inequation is satisfied. In other words, with light source module 1, when power of the combined laser beam Pt is increased from the first power to the second power, the average wavelength of the first laser beam and the average combined-beam wavelength can be lengthened as power of the first laser beam P1 included in the combined laser beam is increased. In such a case, the combined laser beam is combined with the second laser beam having an average wavelength than shorter than an average of the first laser beam. As a result, it is possible to at least partially offset the lengthening of the wavelength of the combined laser beam. In other words, it is possible to reduce the power dependency of the average combined-beam wavelength, by using the second laser beam.

According to the present embodiment, control circuit 50 controls the power of the laser beam of each of the plurality of semiconductor laser elements 6, such that the average combined-beam wavelength which is the average wavelength of the combined laser beam matches the average combined-beam wavelength when all of the plurality of semiconductor laser elements 6 operate at the maximum rated output. In this manner, it is possible to maintain the average combined-beam wavelength constant in a range that includes the maximum rated power of the combined laser beam that can be emitted by light source module 1 (i.e., the power at the maximum rated output). As a result, it is possible to implement a light source module capable of emitting a high-power combined laser beam.

In addition, according to the present embodiment, the average combined-beam wavelength when all of the plurality of semiconductor laser elements 6 operate at the maximum rated output matches the average wavelength of the first laser beam at the minimum laser output. In this manner, it is possible to maintain the average wavelength constant in the entire range from the minimum power to the maximum rated power of the combined laser beam that can be emitted by light source nodule 1.

In addition, when power of the first laser beam P1 is close to the minimum power, the average wavelength of the first laser beam is likely to vary due to a change in temperature, etc. When the first laser beam and the second laser beam are included in the combined laser beam having a power close to the minimum power, power of the first laser beam P1 becomes lower compared to the case where only the first laser beam is included in the combined laser beam, and thus it is difficult to stabilize the average wavelength of the first laser beam. It should be noted that, in this case, power of the second laser beam P2 becomes also approximately lower than or equal to power of the first laser beam P1, and thus it is also difficult to stabilize the average wavelength of the second laser beam. In other words, the average combined-beam wavelength can be stabilized by causing only the first laser beam to be included in the combined laser beam having a power close to the minimum power. Here, when the average wavelength of the first laser beam at the minimum power matches the average combined-beam wavelength at the maximum rated output of the first laser beam and the second laser beam, in the same manner as light source module 1 according to the present embodiment, it is possible to maintain the average combined-beam wavelength to be the average wavelength at the minimum power of the first laser beam over the entire range from the minimum power to the maximum rated power of the combined laser beam. As described above, when the average combined-beam wavelength is maintained at the average wavelength of the first laser beam at minimum power, only the first laser beam is included in the combined laser beam when the power of the combined laser beam is close to the minimum power. As a result, it is possible to stabilize the average combined-beam wavelength when the power is close to the minimum power.

In addition, according to the present embodiment, the average wavelength of the first laser beam at the maximum rated power is at least 5 nm longer than the average wavelength of the first laser beam at the minimum power. As described above, even when the average wavelength of the first laser beam varies by at least 5 nm according to the power, it is possible to maintain the average combined-beam wavelength constant, by appropriately controlling the power of the second laser beam. It should be noted that the average wavelength of the second laser beam at the maximum rated power is at least 5 nm longer than the average wavelength of the second laser beam at the minimum power.

1-3. Processing Method

Figure 5:
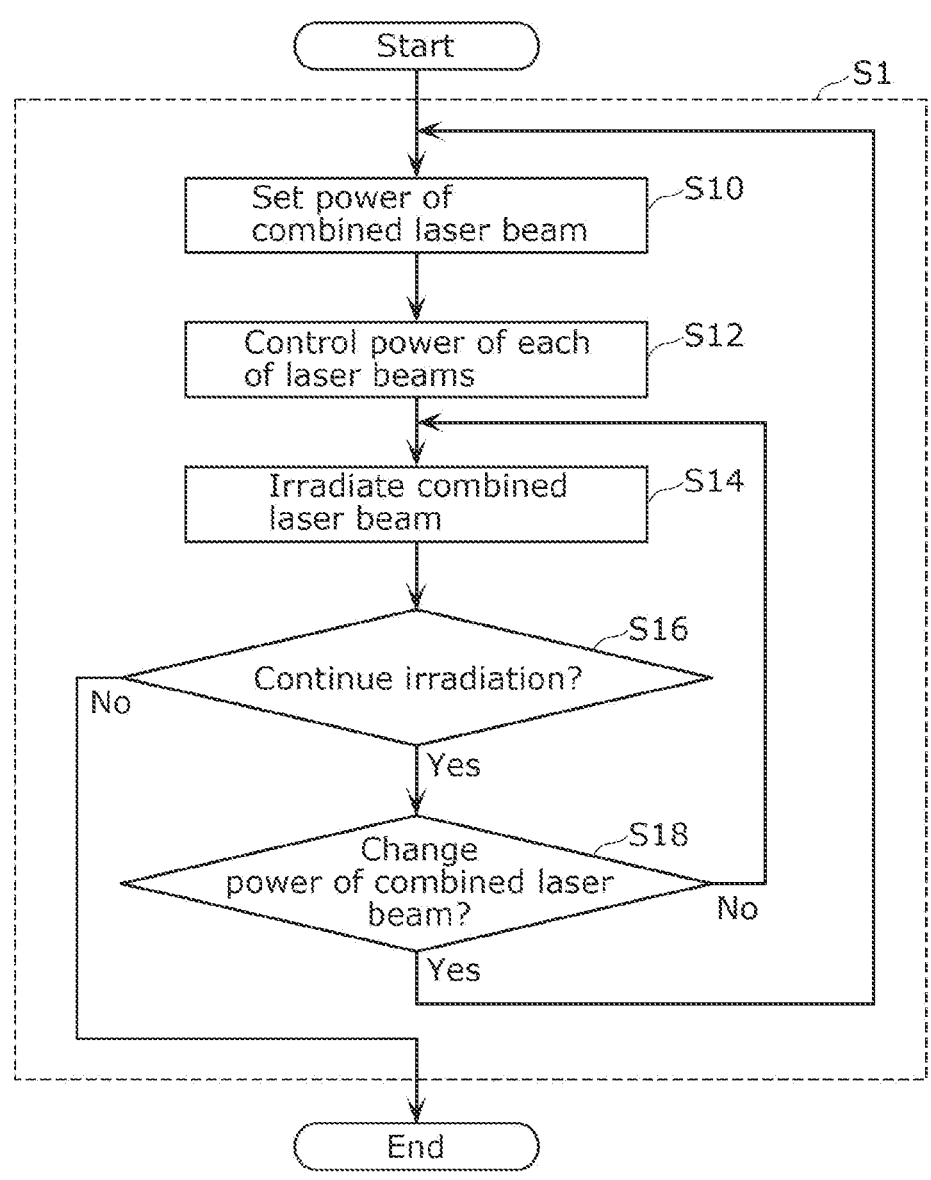
FIG. 5 is a flowchart illustrating a control step included in the processing method using the processing machine according to Embodiment 1.

Next, the processing method using processing machine 2 according to the present embodiment will be described. The processing method according to the present embodiment includes a control step in which the power of the first laser beam and the power of the second laser beam are each controlled to maintain constant the average combined-beam wavelength which is the average wavelength of the combined laser beam, for a change in the power of the combined laser beam. Hereinafter, the control steps included in the processing method according to the present embodiment will be described with reference to FIG. 5. FIG. 5 is a flowchart illustrating control Step S1 included in the processing method in which processing machine 2 according to the present embodiment is used. As illustrated in FIG. 5, control Step S1 includes steps S10 through S18.

As illustrated in FIG. 5, in control Step S1, power of the combined laser beam Pt emitted by processing machine 2 is first set (S10). Power of the combined laser beam Pt is set based on the material, etc. to be processed. Power of the combined laser beam Pt may be set automatically by control circuit 50, or may be set based on a signal input externally by the user or the like.

Next, control circuit 50 controls the power of each of the laser beams, based on the power that has been set in Step S10 (S12). More specifically, control circuit 50 determines the power of each of the first laser beam and the second laser beam, based on the relationship between the power of the combined laser beam and the first and second laser beams, as illustrated in FIG. 2 and FIG. 3. Nest, control circuit 50 controls the current supplied to each of the first semiconductor laser element and the second semiconductor laser element, based on the above-described each of the powers. In this manner, the power of the combined laser beam becomes the power that has been set in Step S10.

Next, processing machine 2 irradiates the material to be processed with the combined laser beam (S14).

Control circuit 50 then determines whether to continue irradiating the material with the combined laser beam (S16). For example, control circuit 50 may determine an irradiation period using a timer or the like, continue irradiation until the irradiation period that has been set elapses, and stop irradiation when the irradiation period elapses. Alternatively, control circuit 50 may continue irradiation until a signal indicating an instruction of stop irradiation is externally input, and stop irradiation when the signal is input.

When control circuit 50 does not continue irradiating the combined laser beam (No in S16), control circuit 50 ends the processing. On the other hand, when control circuit 50 continues irradiating the combined laser beam (Yes in S16), control circuit 50 determines whether to change the power of the combined laser beam (S18). For example, control circuit may determine whether or not a power change is necessary, based on the presence or absence of a signal indicating a power change that is externally input, or may determine whether or not a power change is necessary, based on a predetermined relationship between an irradiation period and power.

When control circuit 50 changes the power of the combined laser beam (Yes in S18), the processing returns back to Step S10 to set the power of the combined laser beam. At this time, even when the power of the combined laser beam is changed, the average combined-beam wavelength is maintained constant. On the other hand, when control circuit 50 does not change the power of the combined laser beam (No in S18), the processing returns back to Step S14 to continue irradiating the combined laser beam.

As described above, in the control step of the processing method according to the present embodiment, it is possible to irradiate the material with a combined laser beam while varying the power of the combined laser beam. Accordingly, even when the processing is carried out while varying the power of the combined laser beam, it is possible to implement stable processing because the variation of the average combined-beam wavelength is reduced.

In the processing method according to the present embodiment, the material to be processed is not particularly limited, but may include Au or Cu. Au and Cu have a relatively high wavelength dependency of a rate of absorption. However, even when performing the processing on such materials, the power dependency of the average wavelength is reduced when performing the processing method according to the present embodiment, and thus it is possible to perform the processing stably even when the power is varied. In addition, Au or Cu has a relatively high rate of absorption for blue laser beams, and thus it is possible to efficiently process the materials containing Au or Cu by using a semiconductor laser element that includes nitride semiconductors as the plurality of semiconductor laser elements 6.

It should be noted that the average combined-beam wavelength is maintained constant in the processing method according to the present embodiment, and the appropriateness of the use of the average combined-beam wavelength in the evaluation of the rate of absorption and absorption coefficient of the combined laser beam in the material will be explained with reference to FIG. 6A and FIG. 6B. FIG.

Figure 6A:
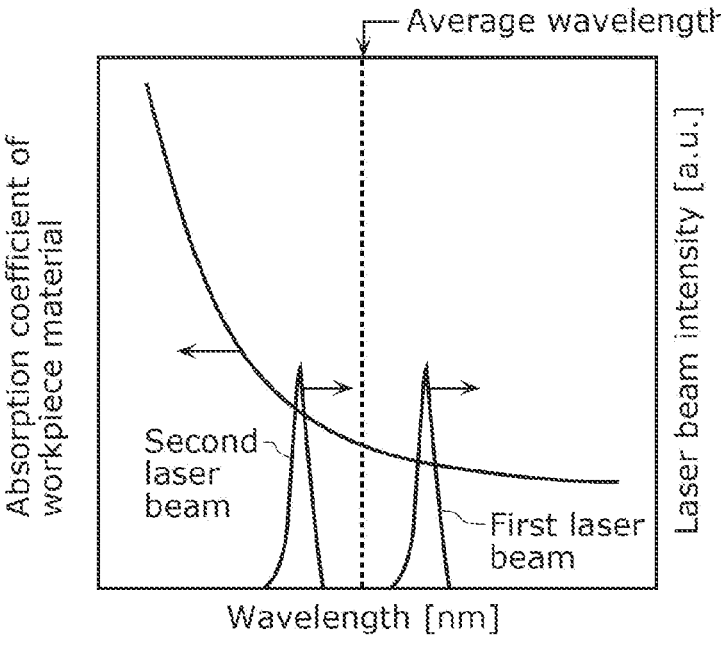
FIG. 6A is a graph schematically illustrating the relationship between the intensity distribution of the combined laser beam and the absorption coefficient of the workpiece material, when the range of the wavelength included in the combined laser beam is narrow.
Figure 6B:
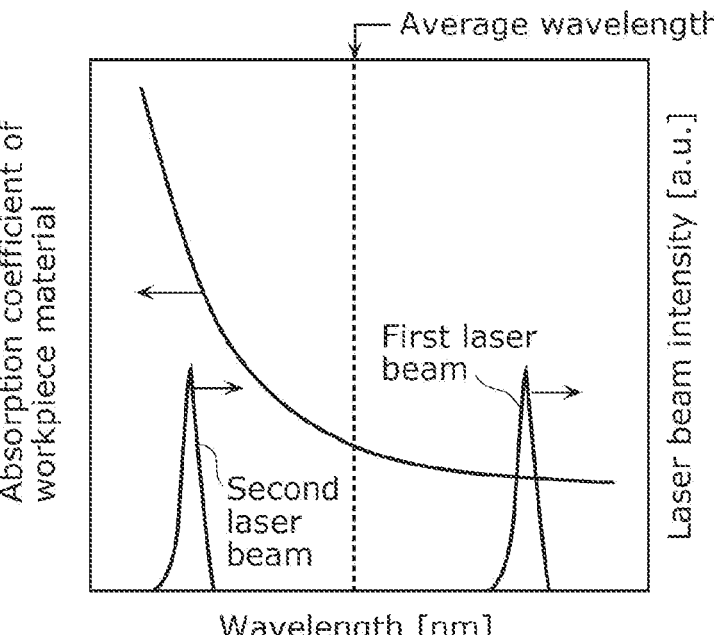
FIG. 6B is a graph schematically illustrating the relationship between the intensity distribution of the combined laser beam and the absorption coefficient of the workpiece material, when the range of the wavelength included in the combined laser beam is wide.

6A and FIG. 6B are graphs schematically illustrating the relationship between the intensity distribution of the combined laser beam and the absorption coefficient of a workpiece material, when the range of the wavelength included in the combined laser beam is narrow and when the range of the wavelength included in the combined laser beam is wide, respectively. In FIG. 6A and FIG. 6B, the horizontal axis indicates the wavelength, the vertical axis on the left indicates the absorption coefficient of the material to be processed (workpiece material), and the vertical axis on the right indicates the laser beam intensity. The absorption coefficients indicted in FIG. 6A and FIG. 6B are absorption coefficients for the same workpiece material, and in this workpiece material, the absorption coefficient decreases as the wavelength increases.

As illustrated in FIG. 6A and FIG. 6B, the absorption coefficient of the workpiece material generally varies nonlinearly with respect to the wavelength. Accordingly, when a plurality of wavelengths are included in the combined laser beam, the actual absorption coefficient of the combined laser beam is not necessarily match the absorption coefficient at the average combined-beam wavelength. In particular, as illustrated in FIG. 6B, the difference between the actual absorption coefficient of the combined laser beam and the absorption coefficient at the average combined-beam wavelength is large when the range of the wavelengths included in the combined laser beam is wide. However, as illustrated in FIG. 6A, when the range of the wavelength included in the combined laser beam is narrow, the absorption coefficient of the workpiece material can be regarded as substantially linear with respect to the wavelength in the range of the wavelengths included in the combined laser beam. For that reason, the difference between the actual absorption coefficient of the combined laser beam and the absorption coefficient at the average combined-beam wavelength can be small enough to be ignored. For example, when the range of the wavelength included in the combined laser beam is approximately 20 nm or less, the difference between the actual absorption coefficient of the combined laser beam and the absorption coefficient at the average combined-beam wavelength is small enough to be ignored for many materials. Therefore, the difference in average wavelength between the first laser beam and the second laser beam may be less than or equal to 20 nm.

Embodiment 2

A light source module according to Embodiment 2 will be described. The light source module according to the present embodiment differs from light source module 1 according to Embodiment 1 mainly in that the plurality of semiconductor laser elements include three element groups. The following describes a light source module according to the present embodiment, focusing on the differences from light source module 1 according to Embodiment 1.

2-1. Overall Configuration

Figure 7:
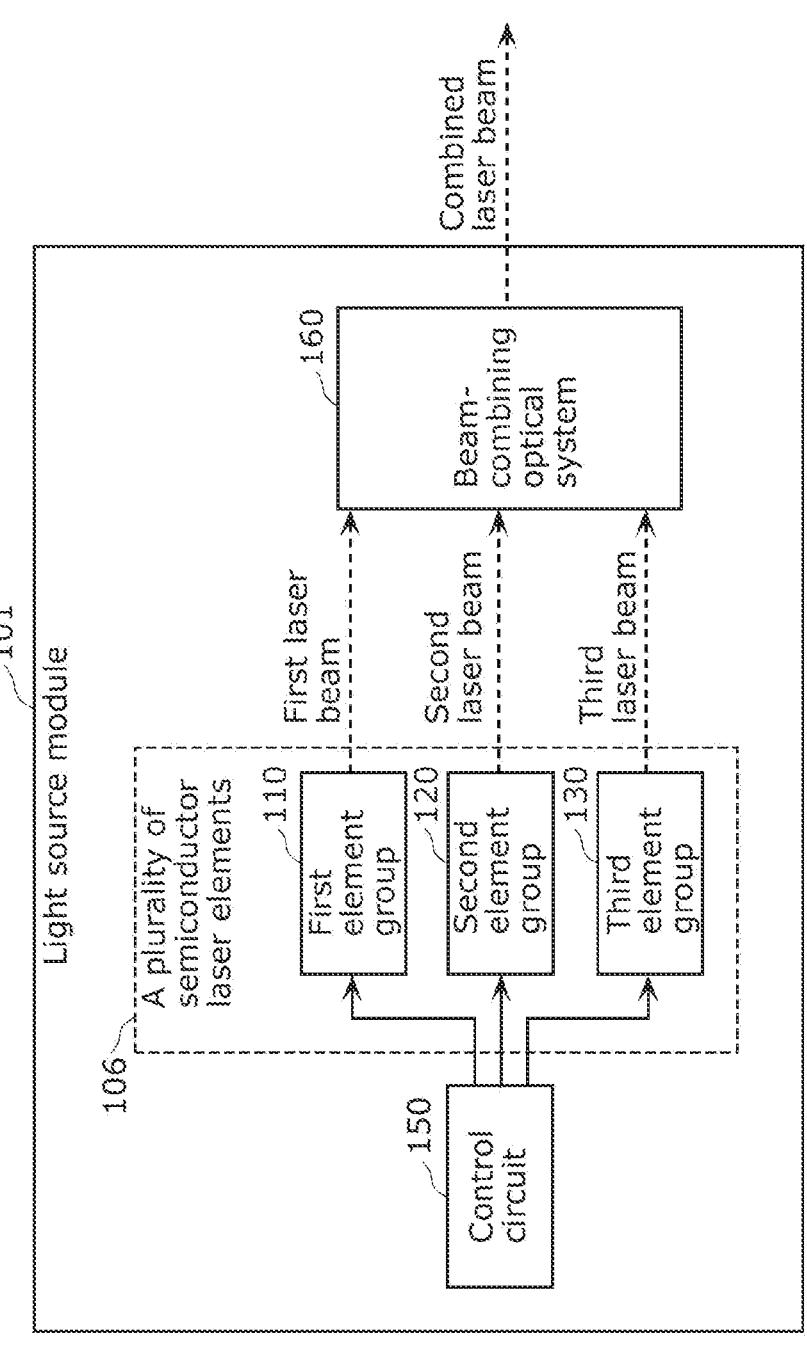
FIG. 7 is a block diagram illustrating a functional configuration of a light source module according to Embodiment 2.

First, the overall configuration of the light source module according to the present embodiment will be described with reference to FIG. 7. FIG. 7 is a block diagram illustrating the functional configuration of light source module 101 according to the present embodiment. As illustrated in FIG. 7, light source module 101 according to the present embodiment includes a plurality of semiconductor laser elements 106, control circuit 150, and beam-combining optical system 160.

The plurality of semiconductor laser elements 106 includes first element group 110 that includes one or more first semiconductor laser elements and emits a first laser beam, second element group 120 that includes one or more second semiconductor laser elements and emits a second laser beam, and third element group 130 that includes one or more third semiconductor laser elements and emits a third laser beam. The first semiconductor laser element included in first element group 110, the second semiconductor laser element included in second element group 120, and the third semiconductor laser element included in third element group 130 differ in the wavelength of the laser beam emitted. When the power of the first laser beam, the second laser beam, and the third laser beam are equal to one another, the average wavelength of the first laser beam is longer than the average wavelength of the second laser beam, and the average wavelength of the second laser beam is longer than the average wavelength of the third laser beam. In addition, the average wavelength of the first laser beam is greater than or equal to the average combined-beam wavelength, and the average wavelength of the third laser beam is less than or equal to the average combined-beam wavelength.

According to the present embodiment, one or more first semiconductor laser elements included in first element group 110 comprise a plurality of first semiconductor laser elements, one or more second semiconductor laser elements included in second element group 120 comprise a plurality of second semiconductor laser elements, and one or more third semiconductor laser elements included in third element group 130 comprise a plurality of third semiconductor laser elements. Each of the plurality of first semiconductor laser elements emits a laser beam having an identical wavelength, each of the plurality of second semiconductor laser elements emits a laser beam having an identical wavelength, and each of the plurality of third semiconductor laser elements emits a laser beam having an identical wavelength.

Control circuit 150 is a controller that controls the power of the laser beam emitted by each of the plurality of semiconductor laser elements 106. Control circuit 150 controls the power of the first laser beam emitted by first element group 110, the power of the second laser beam emitted by second element group 120, and the power of the third laser beam emitted by third element group 130 to maintain the average combined-beam wavelength that is the average wavelength of the combined laser beam constant for a change in the power of the combined laser beam.

According to the present embodiment, control circuit 150 controls the power ratio of the first laser beam, the second laser beam, and the third laser beam, by controlling each of first element group 110, second element group 120, and third element group 130, In this manner, control circuit 150 is capable of controlling the average combined-beam wavelength that is the average wavelength of the combined laser beam. Details of the control method performed by control circuit 150 will be described later.

Beam-combining optical system 160 is an optical system that combines a plurality of laser beams emitted by the plurality of semiconductor laser elements 106. According to the present embodiment, beam-combining optical system 160 combines the first laser beam, the second laser beam, and the third laser beam. Beam-combining optical system 160 emits a combined laser beam including the first laser beam, the second laser beam, and the third laser beam.

2-2. Control Method

Figure 8:
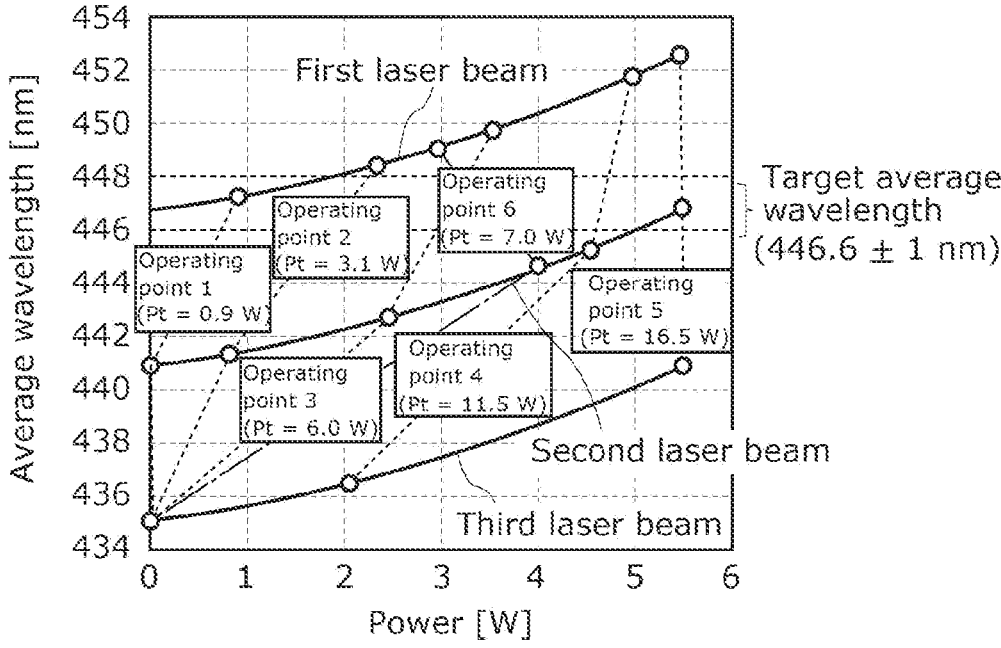
FIG. 8 is a graph illustrating the relationship between the power and the average wavelength of the first laser beam, the second laser beam, and the third laser beam of the light source module according to Embodiment 2.

Next, the control method of light source module 101 according to the present embodiment will be described with reference to FIG. 8 to FIG. 10E. FIG. 8 is a graph illustrating the relationship between the power and the average wave-length of the first laser beam, the second laser beam, and the third laser beam of light source module 101 according to the present embodiment. FIG. 8 also illustrates operating points 1 to 6 indicating the examples of the power of the first laser beam, the power of the second laser beam, and the power of the third laser beam included in the combined laser beam emitted by light source module 101. FIG. 9 is a table illustrating the relationship between the power of the combined laser beam, the first laser beam, the second laser beam, and the third laser beam of light source module 101 according to the present embodiment. FIG. 9 indicates the power of each of the laser beams at operating point 1 to operating point 5. FIG. 10A to FIG. 10E are graphs respectively indicating the optical intensity spectrum of the combined laser beam at operating point 1 to operating point 5 of light source module 101 according to the present embodiment. The horizontal axis of each graph in FIG. 10A to FIG. 10E indicates the wavelength and the vertical axis indicates the optical intensity.

As described above, control circuit 150 controls the power of the first laser beam emitted by first element group 110, the power of the second laser beam emitted by second element group 120, and the power of the third laser beam emitted by third element group 130 to maintain the average combined-beam wavelength that is the average wavelength of the combined laser beam constant for a change in the power of the combined laser beam. According to the present embodiment, as illustrated in FIG. 8, the target average wavelength of the combined laser beam is 446.6±1 nm, which is comparable to the average wavelength of the first laser beam at minimum power. As illustrated in FIG. 8, the average wavelength of the first, second, third laser beams increases as the power increases. For that reason, in order to at least partially offset the change in the average wavelength of the first laser beam, when the average wavelength of the first laser beam is longer than the target average wavelength, the ratio of at least one of the second laser beam or the third laser beam each having an average wavelength shorter than the average wavelength of the first laser beam is increased in the combined laser beam. In this manner, it is possible to reduce the power dependency of the average combined-beam wavelength.

Figure 10A:
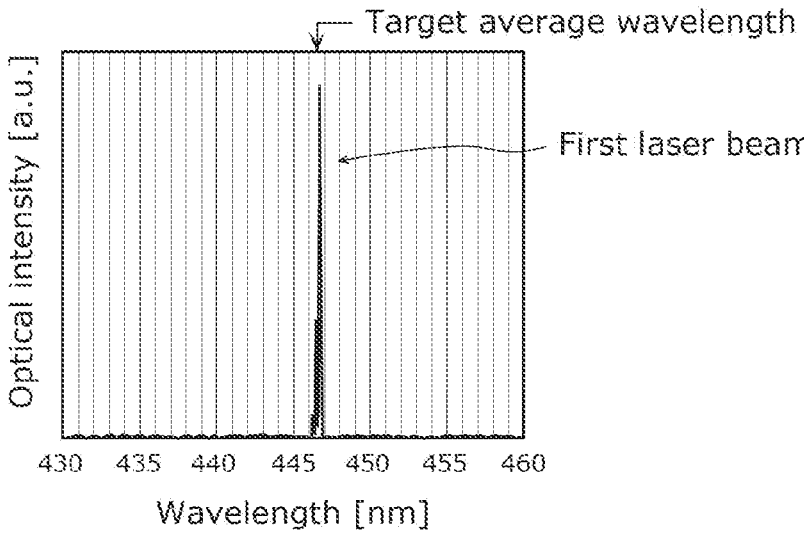
FIG. 10A is a graph indicating an optical intensity spectrum of the combined laser beam at operating point 1 of the light source module according to Embodiment 2.

For example, at operating point 1 at which power of the combined laser beam Pt is 0.9 W, power of the first laser beam P1 is 0.9 W, power of the second laser beam P2 and power of the third laser beam P3 are each 0 W, as illustrated in FIG. 8 and FIG. 9. In this case, as illustrated in FIG. 10A, the combined laser beam includes only the first laser beam which is a laser beam having an average wavelength close to the target average wavelength. As described above, when power of the combined laser beam Pt is low, that is, when power of the combined laser beam Pt falls within the range of power of the first laser beam P1, in which the average wavelength of the first laser beam is approximately the target average wavelength, control circuit 150 causes the plurality of semiconductor laser elements 106 to emit only the first laser beam. In other words, control circuit 150 causes a current corresponding to power of the combined laser beam Pt to be supplied only to the first semiconductor laser element among the plurality of semiconductor laser elements 106.

Figure 10B:
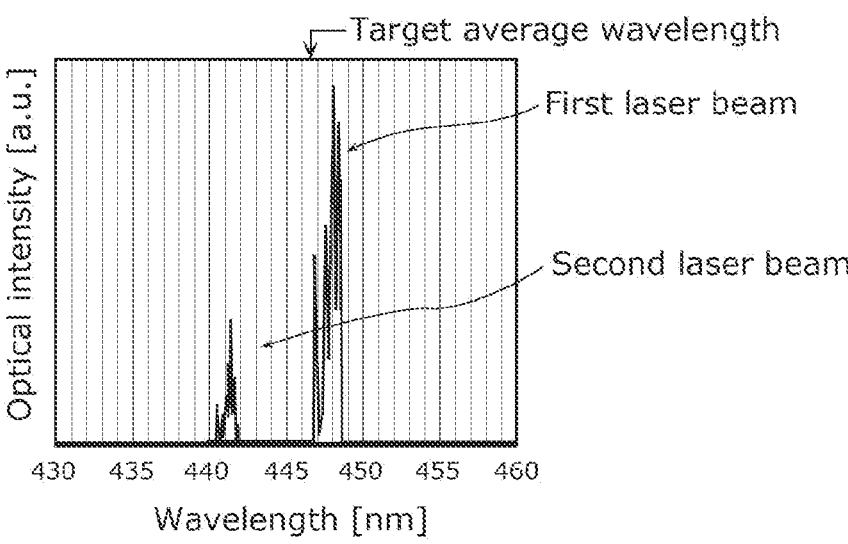
FIG. 10B is a graph indicating an optical intensity spectrum of the combined laser beam at operating point 2 of the light source module according to Embodiment 2.

At operating point 2 at which power of the combined laser beam Pt is 3.1 W, power of the first laser beam P1 is 2.3 W, power of the second laser beam P2 is 0.8 W, and power of the third laser beam P3 is 0 W, as illustrated in FIG. 8 and FIG. 9. In this case, as illustrated in FIG. 10B, the combined laser beam includes a first laser beam having an average wavelength approximately 1 nm longer than the target average wavelength, and a second laser beam having an average wavelength approximately 6 nm shorter than the target average wavelength and significantly lower power than the power of the first laser beam. As described above, when the combined laser beam includes only the first laser beam, in the case where power of the combined laser beam Pt is high to the extent that the average wavelength becomes longer than the target average wavelength, control circuit 150 causes the plurality of semiconductor laser elements 6 to emit, in addition to the first laser beam, at least one of the second laser beam or the third laser beam each having an average wavelength shorter than the average wavelength of the first laser beam. In the example of operating point 2, control circuit 150 causes only the second laser beam out of the second and the third laser beam to be emitted. In other words, control circuit 150 causes a current to be supplied to each of the first semiconductor laser element and the second semiconductor laser element. In this manner, it is possible to make the average combined-beam wavelength shorter than the average wavelength of the first laser beam, so as to be the target average wavelength.

Figure 10C:
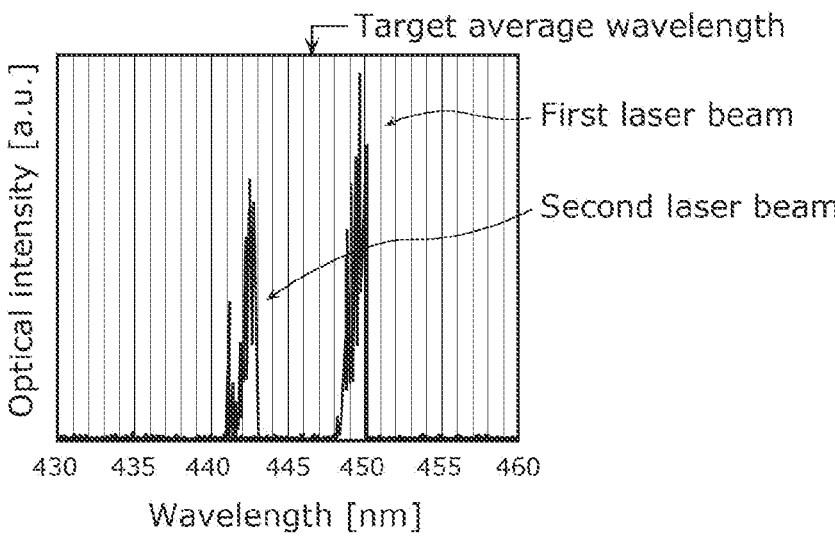
FIG. 10C is a graph indicating an optical intensity spectrum of the combined laser beam at operating point 3 of the light source module according to Embodiment 2.

At operating point 3 at which power of the combined laser beam Pt is 6.0 W, power of the first laser beam P1 is 3.5 W, power of the second laser beam P2 is 2.5 W, and power of the third laser beam P3 is 0 W, as illustrated in FIG. 8 and FIG. 9. In this case, as illustrated in FIG. 10C, the combined laser beam includes the first laser beam having an average wavelength approximately 2 nm longer than the target average wavelength, and the second laser beam having an average wavelength approximately 5 nm shorter than the target average wavelength and power approximately 70% of the power of the first laser beam. As described above, at operating point 3, as with operating point 2, control circuit 150 causes the plurality of semiconductor laser elements 106 to emit, in addition to the first laser beam, the second laser beam having an average wavelength shorter than the average wavelength of the first laser beam.

Figure 10D:
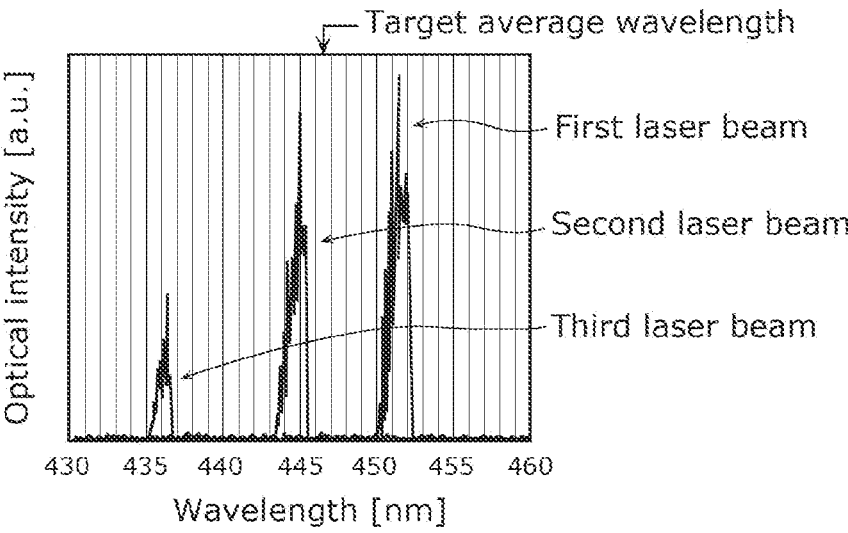
FIG. 10D is a graph indicating an optical intensity spectrum of the combined laser beam at operating point 4 of the light source module according to Embodiment 2.

At operating point 4 at which power of the combined laser beam Pt is 11.5 W, power of the first laser beam P1 is 5.0 W, power of the second laser beam P2 is 4.5 W, and power of the third laser beam P3 is 2.0 W as illustrated in FIG. 8 and FIG. 9. In this case, as illustrated in FIG. 10D, the combined laser beam includes the first laser beam having an average wavelength approximately 4 nm longer than the target average wavelength, the second laser beam having an average wavelength approximately 2 nm shorter than the target average wavelength and power approximately 90% of the power of the first laser beam, and the third laser beam having an average wavelength approximately 11 nm shorter than the target average wavelength and power approximately 40% of the power of the first laser beam. As described above, at operating point 4, control circuit 150 causes the plurality of semiconductor laser elements 106 to emit, in addition to the first laser beam, the second laser beam and the third laser beam each having an average wavelength shorter than the average wavelength of the first laser beam. As described above, by causing the third laser beam to be emitted in addition to the first laser beam and the second laser beam, it is possible to increase the power of the combined laser beam from the maximum value of the power of the combined laser beam according to Embodiment 1. Moreover, the average combined-beam wavelength is maintained constant.

Figure 10E:
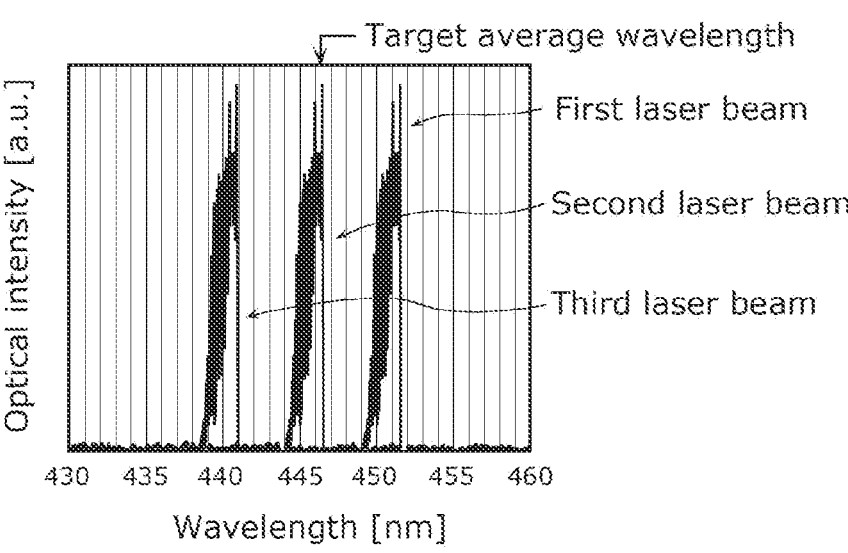
FIG. 10E is a graph indicating an optical intensity spectrum of the combined laser beam at operating point 5 of the light source module according to Embodiment 2.

At operating point 5 at which power of the combined laser beam Pt is 16.5 W, power of the first laser beam P1, power of the second laser beam P2, and power of the third laser beam P3 are each 5.5 W as illustrated in FIG. 8 and FIG. 9. In this case, as illustrated in FIG. 10E, the combined laser beam includes the first laser beam having an average wavelength approximately 5 nm longer than the target average wavelength, the second laser beam having an average wavelength approximately 1 nm shorter than the target average wavelength, and the third laser beam having an average wavelength approximately 5 nm shorter than the target average wavelength. As described above, at operating point 4, control circuit 150 causes the plurality of semiconductor laser elements 106 to emit the first laser beam, the second laser beam, and the third laser beam. As described above, by causing the first laser beam, the second laser beam, and the third laser beam to be emitted, it is possible to significantly increase the power of the combined laser beam from the maximum value of the power of the combined laser beam according to Embodiment 1. Moreover, the average combined-beam wavelength is maintained constant.

It should be noted that each of the above-described operating points is an example of a part of the control mode according to the present embodiment, and control circuit 150 controls the power of the first laser beam emitted by first element group 110, the power of the second laser beam emitted by second element group 120, and the power of the third laser beam emitted by third element group 130, thereby maintaining the average combined-beam wavelength, which is the average wavelength of the combined laser beam, constant for a change in power of the combined laser beam Pt, even when the power of the combined laser beam differs from the power at each of the above-described operating points.

It should be noted that, at each of the operating points of light source module 101 according to the present embodiment, the power of the first laser beam, the power of the second laser beam, and the power of the third laser beam decrease in stated order, but the magnitude correlation of the power of each of the laser beams is not limited to this. For example, as in operating point 6 illustrated in FIG. 8, power of the second laser beam P2 may be the highest. When the combined laser beam includes three or more laser beams as in light source module 101 according to the present embodiment, the power of one of the three or more laser beams is higher than or equal to the power of at least one laser beam that has a shorter wavelength than the one of the three or more laser beams. In addition, when the combined laser beam includes three or more laser beams, the combination of power of three or more laser beams to obtain the combined laser beam Pt and an average wavelength equivalent to those at each of the operating points is not necessarily limited to one.

As described above, even in light source module 101 in which the plurality of semiconductor laser elements 106 include three element groups, it is possible to reduce the power dependency of the average combined-beam wavelength, in the same manner as light source module 1 according to Embodiment 1. In addition, light source module 101 according to the present embodiment does not require a wavelength monitor or other devices used in the technique described in PTL 1, and thus has a simplified configuration.

Embodiment 3

A light source module according to Embodiment 3 will be described. The light source module according to the present embodiment differs from light source module 101 according to Embodiment 2 in that each of the element groups includes a single semiconductor laser element. In addition, in the light source module according to the present embodiment, a specific example of the optical system such as a beam-combining optical system is described. The following describes the light source module according to the present embodiment with reference to FIG. 11, focusing on the differences from light source module 101 according to Embodiment 2.

Figure 11:
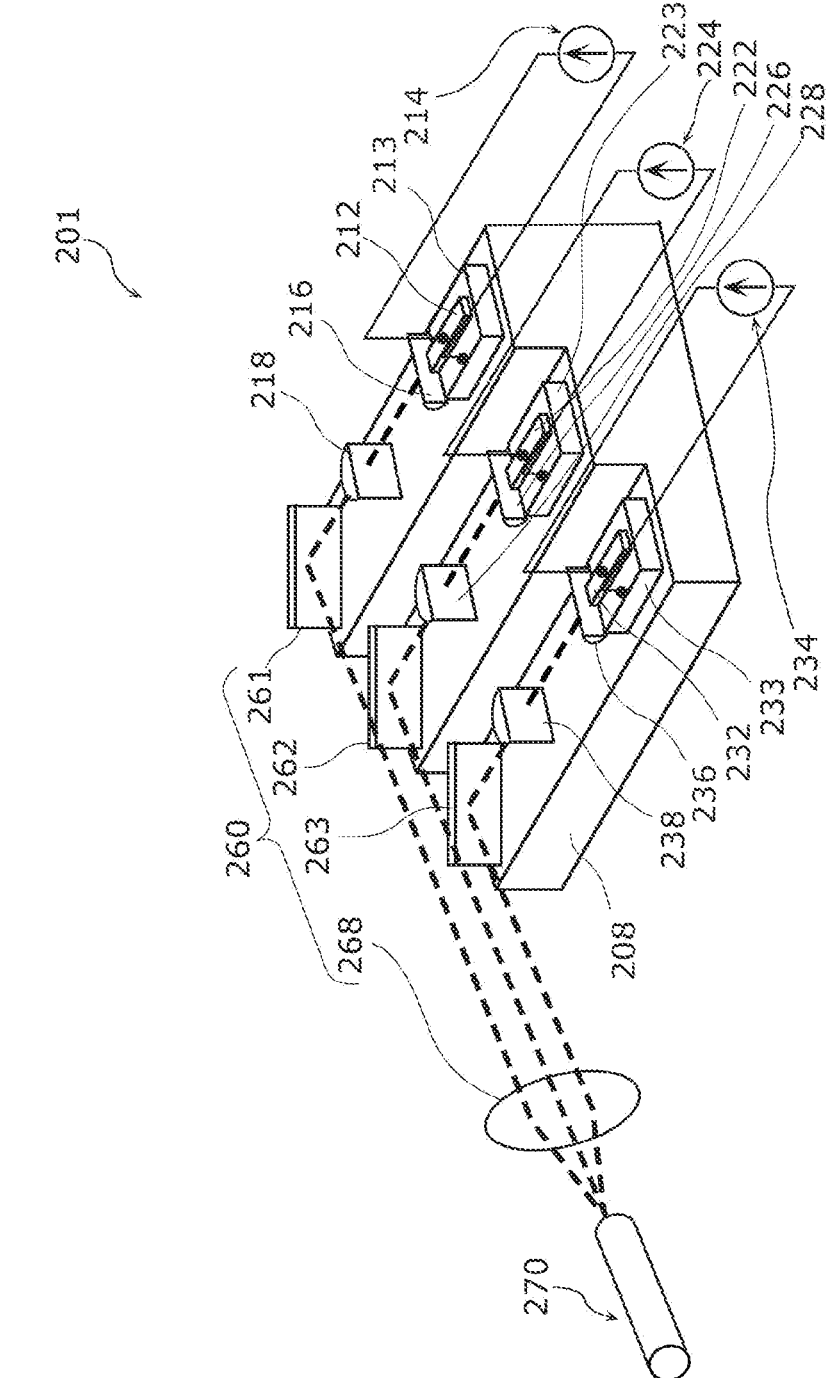
FIG. 11 is a perspective view illustrating the configuration of a light source module according to Embodiment 3.

FIG. 11 is a perspective view illustrating the configuration of light source module 201 according to the present embodiment. FIG. 11 also illustrates light guide portion 270. According to the present embodiment, light guide portion 270 is an optical fiber that guides the combined laser beam. Light source module 201 according to the present embodiment includes a plurality of semiconductor laser elements and a control circuit, as with light source module 101 according to Embodiment 2. It should be noted that the illustration of the control circuit is omitted in FIG. 11. Light source module 201 according to the present embodiment further includes base 208, power supplies 214, 224, and 234, submounts 213, 223, and 233, fast axis collimators 216, 226, and 236, slow axis collimators 218, 228, and 238, and beam-combining optical system 260.

The plurality of semiconductor laser elements include a first element group that includes first semiconductor laser element 212 and emits a first laser beam, a second element group that includes second semiconductor laser element 222 and emits a second laser beam, and a third element group that includes third semiconductor laser element 232 and emits a third laser beam. First semiconductor laser element 212, second semiconductor laser element 222, and third semiconductor laser element 232 emit laser beams having respectively different wavelengths. When the power of the first laser beam, the power of the second laser beam, and the power of the third laser beam are equal to one another, the average wavelength of the first laser beam is greater than the average wavelength of the second laser beam, and the average wavelength of the second laser beam is greater than the average wavelength of the third laser beam. In addition, the average wavelength of the first laser beam is greater than or equal to the average combined-beam wavelength, and the average wavelength of the third laser beam is less than or equal to the average combined-beam wavelength.

Base 208 is a component on which a plurality of semiconductor laser elements are disposed, According to the present embodiment, a portion of beam-combining optical system 260 and other optical elements are also disposed on base 208. Base 208 has a staircase-like shape and has three mounting surfaces of different heights. As illustrated in FIG. 11, a semiconductor laser element, etc. are placed on each of the mounting surfaces of base 208. As illustrated in FIG. 11, first semiconductor laser element 212, submount 213, fast axis collimator 216, slow axis collimator 218, and reflective mirror 261 are disposed on the highest mounting surface of base 208, according to the present embodiment. Second semiconductor laser element 222, submount 223, fast axis collimator 226, slow axis collimator 228, and reflective mirror 262 are disposed on the second highest mounting surface of base 208. Third semiconductor laser element 232, submount 233, fast axis collimator 236, slow axis collimator 238, and reflective mirror 263 are disposed on the lowest mounting surface of base 208. First semiconductor laser element 212, second semiconductor laser element 222, and third semiconductor laser element 232 are arranged in a one-dimensional array at equal intervals. In other words, first semiconductor laser element 212, second semiconductor laser element 222, and third semiconductor laser element 232 are arranged in a row at equal intervals. It should be noted that a prism or other deflecting element may be used instead of the reflective mirror.

Power supplies 214, 224, and 234 are devices that supply current to first semiconductor laser element 212, second semiconductor laser element 222, and third semiconductor laser element 232, respectively. Each of the power supplies is controlled by a control circuit that is not illustrated. In this manner, the current supplied to each of the semiconductor laser elements is controlled.

Submounts 213, 223, and 233 are the bases on which first semiconductor laser element 212, second semiconductor laser element 222, and third semiconductor laser element 232 are disposed, respectively, and are each a component having a cuboid shape. A conductive layer is formed on the surface on which the semiconductor laser element of each of the submounts is disposed, and the semiconductor laser element is mounted on the conductive layer, and a current is supplied to the semiconductor laser element through the conductive layer.

Fast axis collimators 216, 226, and 236 are optical elements that collimate the laser beams emitted from first semiconductor laser element 212, second semiconductor laser element 222, and third semiconductor laser element 232, respectively, in the fast axis direction. Fast axis collimators are disposed in proximity to the laser beam emission surfaces of the respective semiconductor laser elements. As each of the fast axis collimators, for example, an aspheric lens such as a cylindrical lens can be used. As each of the fast axis collimators, an aspherical mirror such as a cylindrical mirror may be used.

Slow axis collimators 218, 228, and 238 are optical elements that collimate the laser beams emitted from first semiconductor laser element 212, second semiconductor laser element 222, and third semiconductor laser element 232, respectively, in the slow axis direction. Each of the slow axis collimators is located downstream of each laser beam from each of the fast axis collimators. As each of the slow axis collimators, for example, an aspheric lens such as a cylindrical lens can be used. As each of the slow axis collimators, an aspherical mirror such as a cylindrical mirror may be used.

Beam-combining optical system 260 is an optical system that combines a plurality of laser beams emitted by the plurality of semiconductor laser elements. According to the present embodiment, beam-combining optical system 260 combines the first laser beam, the second laser beam, and the third laser beam. Beam-combining optical system 260 emits a combined laser beam including the first laser beam, the second laser beam, and the third laser beam. Beam-combining optical system 260 includes reflective mirrors 261, 262, and 263, and light collecting element 268.

Reflective mirrors 261, 262, and 263 are optical elements that reflect the first laser beam, the second laser beam, and the third laser beam, respectively. Each of the reflective mirrors reflects the direction of propagation of the incident laser beam toward light collecting element 268. For example, a planar mirror or the like can be used as each of the reflective mirrors.

Light collecting element 268 is an optical element that combines a plurality of incident laser beams by focusing them. According to the present embodiment, light collecting element 268 focuses the first laser beam, the second laser beam, and the third laser beam to form a combined laser beam. In the example illustrated in FIG. 11, the combined laser beam emitted from light collecting element 268 enters light guide portion 270. As light collecting element 268, for example, a lens such as a spherical lens can be used. A light collecting mirror such as a spherical mirror may be used as light collecting element 268.

The advantageous effect same as the advantageous effect yielded by the light source module according to each of the above-described embodiments can also be yielded by light source module 201 according to the present embodiment.

Embodiment 4

A light source module according to Embodiment 4 will be described. The light source module according to the present embodiment differs from light source module 201 according to Embodiment 3 in that each of the element groups includes two semiconductor laser elements. In addition, the light source module according to the present embodiment also differs from light source module 201 according to Embodiment 3 in that the two semiconductor laser elements included in each of the element groups are connected in series. The following describes the light source module according to the present embodiment with reference to FIG. 12, focusing on the differences from light source module 101 according to Embodiment 2.

Figure 12:
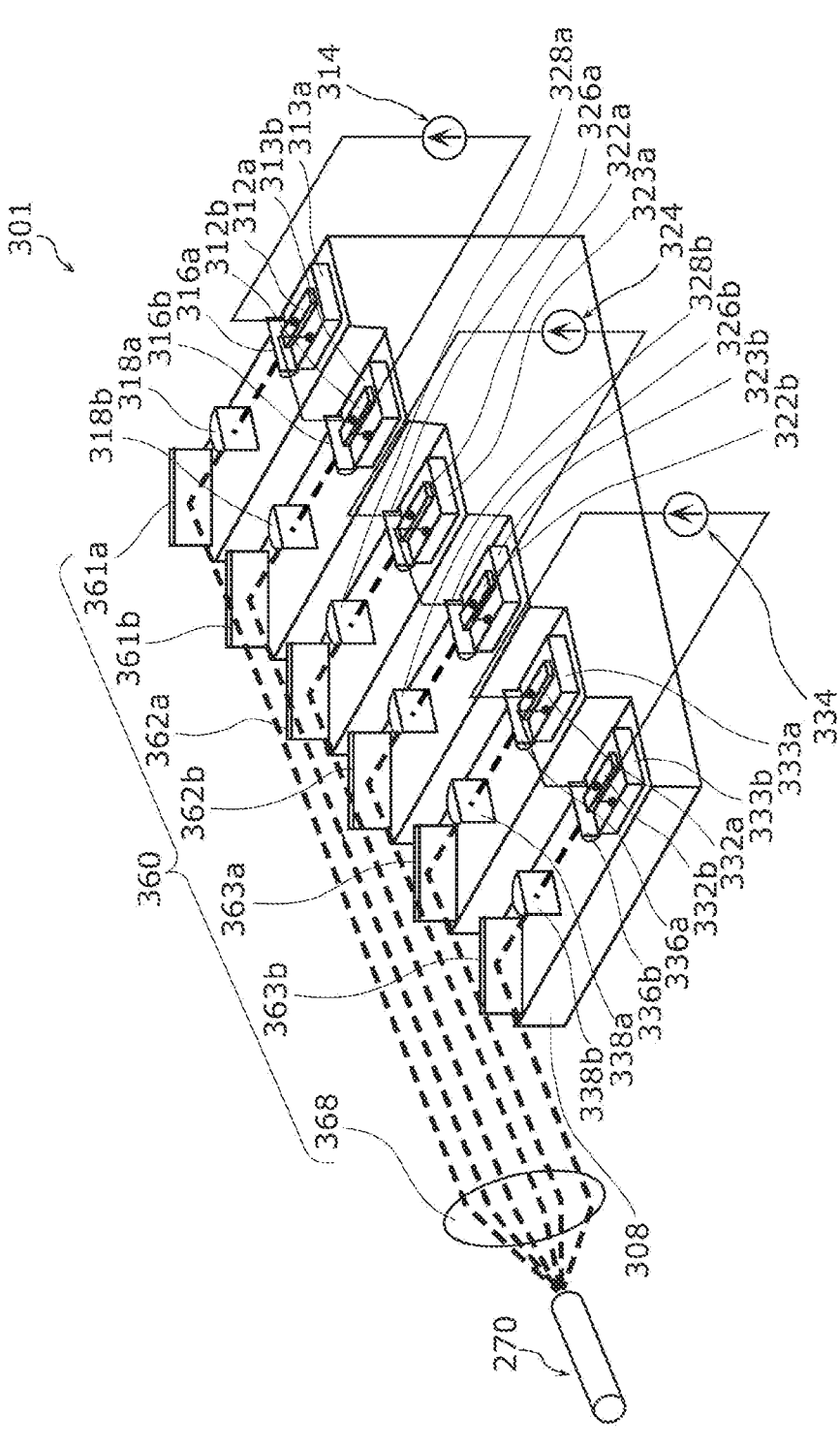
FIG. 12 is a perspective view illustrating the configuration of a light source module according to Embodiment 4.
Figure 13:
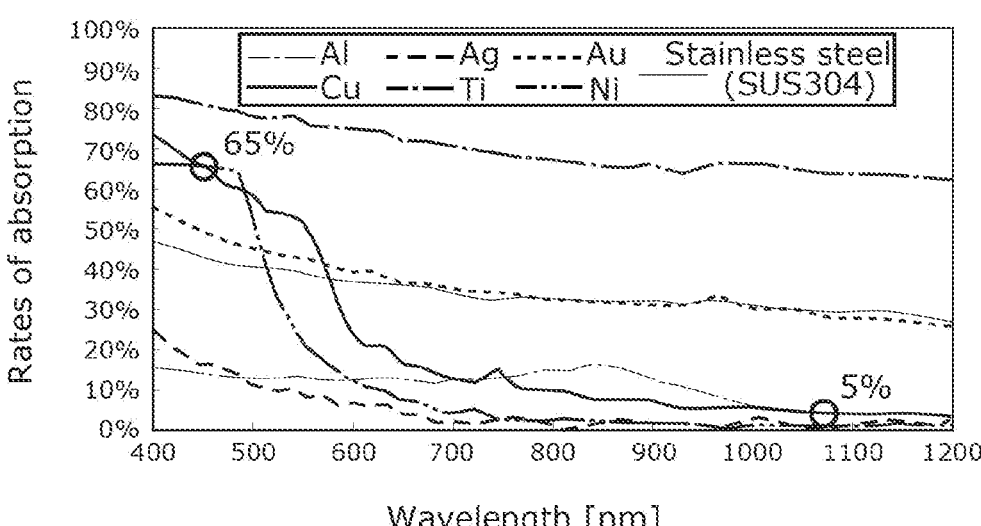
FIG. 13 is a graph illustrating the optical absorption spectrum of metals.

FIG. 12 is a perspective view illustrating the configuration of light source module 301 according to the present embodiment. FIG. 12 also illustrates light guide portion 270 that functions as a light guide portion. Light source module 301 according to the present embodiment includes a plurality of semiconductor laser elements and a control circuit, in the same manner as light source module 201 according to Embodiment 3. It should be noted that the illustration of the control circuit is omitted in FIG. 12. Light source module 301 according to the present embodiment further includes base 308, power supplies 314, 324, and 334, submounts 313a, 313b, 323a, 323b, 333a, and 333b, fast axis collimators 316a, 316b, 326a, 326b, 336a, and 336b, slow axis collimators 318a, 318b, 328a, 328b, 338a, and 338b, and beam-combining optical system 360.

The plurality of semiconductor laser elements include a first element group that includes first semiconductor laser elements 312a and 312b and emits a first laser beam, a second element group that includes second semiconductor laser elements 322a and 322b and emits a second laser beam, and a third element group that includes third semiconductor laser element 332a and 332b and emits a third laser beam. First semiconductor laser elements 312a and 312b, second semiconductor laser elements 322a and 322b, and third semiconductor laser elements 332a and 332b emit laser beams having respectively different wavelengths. When the power of the first laser beam, the power of the second laser beam, and the power of the third laser beam are equal to one another, the average wavelength of the first laser beam is greater than the average wavelength of the second laser beam, and the average wavelength of the second laser beam is greater than the average wavelength of the third laser beam. In addition, the average wavelength of the first laser beam is greater than or equal to the average combined-beam wavelength, and the average wavelength of the third laser beam is less than or equal to the average combined-beam wavelength.

Base 308 is a component on which a plurality of semiconductor laser elements are disposed. According to the present embodiment, a portion of beam-combining optical system 360 and other optical elements are also disposed on base 308. Base 308 has a staircase-like shape and has six mounting surfaces of different heights. As illustrated in FIG. 12, a semiconductor laser element, etc. are disposed on each of the mounting surfaces of base 308.

Power supplies 314, 324, and 334 are devices that supply current to first semiconductor laser elements 312a and 312b, second semiconductor laser elements 322a and 322b, and third semiconductor laser elements 332a and 332b, respectively. Each of the power supplies is controlled by a control circuit that is not illustrated. In this manner, the current supplied to each of the semiconductor laser elements is controlled. According to the present embodiment, first semiconductor laser elements 312a and 312b are connected in series. In addition, second semiconductor laser elements 322a and 322b are also connected in series, and third semiconductor laser elements 332a and 332b are also connected in series.

It should be noted that, although first semiconductor laser elements 312a and 312b, second semiconductor laser elements 322a and 322b, and third semiconductor laser elements 332a and 332b are respectively arranged adjacent to each other and connected in series according to the present embodiment, they need not necessarily be arranged adjacent to each other. For example, first semiconductor laser elements 312a and 312b may be disposed apart at the top stair and the bottom stair of the staircase-like mounting surface including six stairs as long as they are electrically connected in series. Alternatively, first semiconductor laser elements 312a and 312b, second semiconductor laser elements 322a and 322b, and third semiconductor laser elements 332a and 332b may be respectively arranged adjacent to each other on the same mounting surface and connected in series.

Submount 313a and submount 313b are the bases on which first semiconductor laser element 312a and first semiconductor laser element 312b are disposed, respectively. Submount 323a and submount 323b are the bases on which second semiconductor laser element 322a and second semiconductor laser element 322b are disposed, respectively. Submount 333a and submount 333b are the bases on which third semiconductor laser element 332a and third semiconductor laser element 332b are disposed, respectively. Each of the submounts according to the present embodiment has the configuration same as the configuration of each of submounts according to Embodiment 3.

Fast axis collimators 316a and 316b are optical elements that respectively collimate the laser beams emitted from first semiconductor laser elements 312a and 312b, in the fast axis direction. Fast axis collimators 326a and 326b are optical elements that respectively collimate the laser beams emitted from second semiconductor laser elements 322a and 322b, in the fast axis direction. Fast axis collimators 336a and 336b are optical elements that respectively collimate the laser beams emitted from third semiconductor laser elements 332a and 332b, in the fast axis direction. Each of the fast axis collimators according to the present embodiment has the configuration same as the configuration of each of the fast axis collimators according to Embodiment 3.

Slow axis collimators 318a and 318b are optical elements that respectively collimate the laser beams emitted from first semiconductor laser elements 312a and 312b, in the slow axis direction. Slow axis collimators 328a and 328b are optical elements that respectively collimate the laser beams emitted from second semiconductor laser elements 322a and 322b, in the slow axis direction. Slow axis collimators 338a and 338b are optical elements that respectively collimate the laser beams emitted from third semiconductor laser elements 332a and 332b, in the slow axis direction. Each of the slow axis collimators according to the present embodiment has the configuration same as the configuration of each of the slow axis collimators according to Embodiment 3.

Beam-combining optical system 360 is an optical system that combines a plurality of laser beams emitted by the plurality of semiconductor laser elements. According to the present embodiment, beam-combining optical system 360 combines the first laser beam, the second laser beam, and the third laser beam. The first laser beam includes laser beams emitted by first semiconductor laser elements 312a and 312b. The second laser beam includes laser beams emitted by second semiconductor laser elements 322a and 322b. The third laser beam includes laser beams emitted by third semiconductor laser elements 332a and 332b. Beam-combining optical system 360 emits a combined laser beam including the first laser beam, the second laser beam, and the third laser beam. Beam-combining optical system 360 includes reflective mirrors 361a, 361b, 362a, 362b, 363a, and 363b, and light collecting element 368.

Reflective mirrors 361a and 361b are optical elements that reflect, among the first laser beams, the laser beams emitted by first semiconductor laser elements 312a and 312b, respectively. Reflective mirrors 362a and 362b are optical elements that reflect, among the second laser beams, the laser beams emitted by second semiconductor laser elements 322a and 322b, respectively. Reflective mirrors 363a and 363b are optical elements that reflect, among the third laser beams, the laser beams emitted by third semiconductor laser elements 332a and 332b, respectively. Each of the reflective mirrors according to the present embodiment has the configuration same as the configuration of each of the reflective mirrors according to Embodiment 3.

Light collecting element 368 is an optical element that combines a plurality of incident laser beams by focusing them. According to the present embodiment, light collecting element 368 focuses the first laser beam, the second laser beam, and the third laser beam to form a combined laser beam. Light collecting element 368 has the configuration same as the configuration of light collecting element 268 according to Embodiment 3.

The advantageous effect same as the advantageous effect yielded by the light source module according to each of the above-described embodiments can also be yielded by light source module 301 according to the present embodiment. In addition, according to the present embodiment, the plurality of semiconductor laser elements are connected in series in each of the element groups, and thus it is possible to reduce the amount of current required to drive light source module 301 compared to the case where the plurality of semiconductor laser elements are connected in parallel. As a result, it is possible to downsize power supplies 314, 324, and 334 necessary for driving light source module 301.

(Variation, etc.)

The light source module, the processing machine, and the processing method according to the present disclosure have been described thus far based on the respective embodiments, but the present disclosure is not limited to the above-described embodiments.

For example, each of the light source modules according to Embodiments 2 to 4 may be used in place of light source module 1 in processing machine 2 according to the above-described Embodiment 1.

In addition, each of the element groups includes a plurality of semiconductor laser elements according to the above-described Embodiments 1, 2, and 4, but each of the element groups may include only a single semiconductor laser element.

In addition, according to the above-described embodiments, the average combined-beam wavelength at the time when all of the plurality of semiconductor laser elements operate at their maximum rated output matches the average wavelength of the first laser beam at its minimum laser output, but the average wavelengths need not necessarily match.

In addition, according to the above-described embodiments, although semiconductor laser elements including nitride semiconductors are used as semiconductor laser elements included in the plurality of semiconductor laser elements, semiconductor laser elements of other material systems, such as GaAs-based semiconductor laser elements may be used as the semiconductor laser elements included in the plurality of semiconductor laser elements.

In addition, although the plurality of semiconductor laser elements include two or three element groups according to the above-described embodiments, four or more element groups may be included.

In addition, although the example in which light source module 1 is included in processing machine 2 has been described in the above-described Embodiment 1, light source module 1 may also be used in a device other than processing machine 2, such as a lighting device, etc.

In addition, although the plurality of semiconductor laser elements 1 are arranged in a one-dimensional array according to the above-described Embodiments 3 and 4, the plurality of semiconductor laser elements 1 may be arranged in a two-dimensional array. For example, a stack structure in which semiconductor laser elements are arranged above semiconductor laser elements may be adopted as the arrangement structure of the plurality of semiconductor laser elements.

In addition, forms obtained by various modifications to the respective exemplary embodiments described above that can be conceived by a person of skill in the art as well as forms realized by arbitrarily combining structural components and functions in the respective exemplary embodiments described above which are within the scope of the essence of the present disclosure are also included in the present disclosure.

INDUSTRIAL APPLICABILITY

The light source module, etc. according to the present disclosure can be applied, for example, to laser processing machines capable of high-power and stable processing.

The invention claimed is:

1. A light source module that emits a combined laser beam, the light source module comprising:

a plurality of semiconductor laser elements; and a control circuit that controls power of a laser beam emitted by each of the plurality of semiconductor laser elements, wherein the plurality of semiconductor laser elements include:

a first element group that includes one or more first semiconductor laser elements and emits a first laser beam; and a second element group that includes one or more second semiconductor laser elements and emits a second laser beam, the combined laser beam includes at least one of the first laser beam or the second laser beam, the control circuit controls power of the first laser beam and power of the second laser beam to maintain an average combined-beam wavelength constant for a change in power of the combined laser beam, the average combined-beam wavelength being an average wavelength of the combined laser beam, when the power of the first laser beam and the power of the second laser beam are equal to each other, an average wavelength of the first laser beam is longer than an average wavelength of the second laser beam, the average wavelength of the first laser beam increases as the power of the first laser beam increases, and the control circuit controls the power of the first laser beam and the power of the second laser beam to increase a ratio of the second laser beam in the combined laser beam as the power of the first laser beam increases.

2. The light source module according to claim 1, wherein the power of the first laser beam is higher than or equal to the power of the second laser beam.

3. The light source module according to claim 1, wherein the one or more first semiconductor laser elements comprise a plurality of first semiconductor laser elements, and the plurality of first semiconductor laser elements each emit a laser beam having an identical wavelength.

4. The light source module according to claim 3, wherein the plurality of first semiconductor laser elements are connected in series.

5. The light source module according to claim 1, wherein $\lambda 12 - \lambda 11 > \lambda t2 - \lambda t1$ is satisfied, where:

$\lambda 11$ denotes the average wavelength of the first laser beam and $\lambda t1$ denotes the average combined-beam wavelength, when the power of the combined laser beam is first power; and $\lambda 12$ denotes the average wavelength of the first laser beam and $\lambda t2$ denotes the average combined-beam wavelength, when the power of the combined laser beam is second power higher than the first power.

6. The light source module according to claim 1, wherein when all of the plurality of semiconductor laser elements operate at a maximum rated output, the average combined-beam wavelength matches the average wavelength of the first laser beam at a minimum laser output.

7. The light source module according to claim 1, wherein the average wavelength of the first laser beam at a maximum rated power is at least 5 nm longer than the average wavelength of the first laser beam at a minimum power.

8. The light source module according to claim 1, wherein the control circuit controls the power of the laser beam emitted by each of the plurality of semiconductor laser elements so as to cause the combined-beam wavelength to match the average combined-beam wavelength when all of the plurality of semiconductor laser elements operate at a maximum rated output.

9. The light source module according to claim 1, wherein the one or more first semiconductor laser elements and the one or more second semiconductor laser elements each include a nitride semiconductor.

10. The light source module according to claim 1, wherein a difference between the average wavelength of the first laser beam and the average wavelength of the second laser beam is less than or equal to 20 nm.

11. The light source module according to claim 1, wherein the average combined-beam wavelength laser beam is at least 400 nm and at most 500 nm.

12. A processing machine comprising:
the light source module according to claim 1.

13. A light source module that emits a combined laser beam, the light source module comprising:
a plurality of semiconductor laser elements; and
a control circuit that controls power of a laser beam emitted by each of the plurality of semiconductor laser elements, wherein the plurality of semiconductor laser elements include:
a first element group that includes one or more first semiconductor laser elements and emits a first laser beam; and
a second element group that includes one or more second semiconductor laser elements and emits a second laser beam, the combined laser beam includes at least one of the first laser beam or the second laser beam, the control circuit controls power of the first laser beam and power of the second laser beam to maintain an average combined-beam wavelength constant for a change in power of the combined laser beam, the average combined-beam wavelength being an average wavelength of the combined laser beam, when the power of the first laser beam and the power of the second laser beam are equal to each other, an average wavelength of the first laser beam is longer than an average wavelength of the second laser beam, the average wavelength of the first laser bean increases as the power of the first laser beam increases, the control circuit controls the power of the first laser beam and the power of the second laser beam to increase a ratio of the second laser beam in the combined laser beam as the power of the first laser beam increases, and $\lambda 12 - \lambda 11 > \lambda t2 - \lambda t1$ is satisfied, where:

$\lambda 11$ denotes the average wavelength of the first laser beam and $\lambda t1$ denotes the average combined-beam wavelength, when the power of the combined laser beam is first power; and $\lambda 12$ denotes the average wavelength of the first laser beam and $\lambda t2$ denotes the average combined-beam wavelength, when the power of the combined laser beam is second power higher than the first power.

14. The light source module according to claim 13, wherein
the average combined-beam wavelength is at least 400 nm and at most 500 nm.

15. A processing method of processing a material using a combined laser beam emitted from a light source module, the light source module including a plurality of semiconductor laser elements, the plurality of semiconductor laser elements including:
a first element group that includes one or more first semiconductor laser elements and emits a first laser beam; and
a second element group that includes one or more second semiconductor laser elements and emits a second laser beam, the combined laser beam including at least one of the first laser beam or the second laser beam, the processing method comprising:

controlling power of the first laser beam and power of the second laser beam to maintain an average combined-beam wavelength constant for a change in power of the combined laser beam, the average combined-beam wavelength being an average wavelength of the combined laser beam, wherein when the power of the first laser beam and the power of the second laser beam are equal to each other, an average wavelength of the first laser beam is longer than an average wavelength of the second laser beam, the average wavelength of the first laser beam Increases as the power of the first laser beam increases, and in the controlling, the power of the first laser beam and the power of the second laser beam are each controlled to increase a ratio of the second laser beam in the combined laser beam as the power of the first laser beam increases.

16. The processing method according to claim 15, wherein $\lambda 12-\lambda 11>\lambda t2-\lambda t1$ is satisfied, where:

$\lambda 11$ denotes the average wavelength of the first laser beam and $\lambda t1$ denotes the average combined-beam wavelength, when the power of the combined laser beam is first power; and $\lambda 12$ denotes the average wavelength of the first laser beam and $\lambda t2$ denotes the average combined-beam wavelength, when the power of the combined laser beam is second power higher than the first power.

17. The processing method according to claim 15, wherein a difference between the average wavelength of the first laser beam and the average wavelength of the second laser beam is less than or equal to 20 nm.

18. The processing method according to claim 15, wherein the average combined-beam wavelength is at least 400 nm and at most 500 nm.

19. The processing method according to claim 15, wherein the material includes Au or Cu.

20. The processing method according to claim 15, wherein the controlling includes irradiating the material with the combined laser beam while varying the power of the combined laser beam.

* * * * *